(12) United States Patent
Farahi

(10) Patent No.: US 7,058,245 B2
(45) Date of Patent: Jun. 6, 2006

(54) INTEGRATED OPTICAL CIRCUITS

(75) Inventor: Faramarz Farahi, Concord, NC (US)

(73) Assignee: Waveguide Solutions, Inc., Charlotte, NC (US)

( * ) Notice: Subject to any disclaimer, the term of this patent is extended or adjusted under 35 U.S.C. 154(b) by 630 days.

(21) Appl. No.: 09/803,342

(22) Filed: Mar. 9, 2001

(65) Prior Publication Data

US 2001/0041025 A1    Nov. 15, 2001

Related U.S. Application Data

(60) Provisional application No. 60/194,663, filed on Apr. 4, 2000.

(51) Int. Cl.
*G02B 6/122* (2006.01)
*G02B 6/13* (2006.01)

(52) U.S. Cl. .................... 385/14; 372/39; 385/129; 385/147

(58) Field of Classification Search ............ 385/10–14, 385/2, 4, 17, 37, 16, 143; 427/573, 164, 427/579, 574, 563; 372/6, 39, 42, 45, 49, 372/96, 92, 102
See application file for complete search history.

(56) References Cited

U.S. PATENT DOCUMENTS

| | | | |
|---|---|---|---|
| 3,810,688 A | 5/1974 | Ballman et al. |
| 3,923,373 A | 12/1975 | Dabby et al. |
| 4,037,005 A | 7/1977 | Phillips |
| 4,068,920 A | 1/1978 | Bass et al. |
| 4,181,399 A | 1/1980 | McMahon et al. |
| 4,262,994 A | 4/1981 | Sheem |
| 4,323,381 A | 4/1982 | Matsuyama et al. |
| 4,417,910 A | 11/1983 | Passaret |
| 4,680,046 A | 7/1987 | Matsuo et al. |
| 4,680,049 A | 7/1987 | Onorato et al. |
| 4,707,174 A | 11/1987 | Johnson, Jr. et al. |
| 4,715,672 A | 12/1987 | Duguay et al. |
| 4,765,702 A | 8/1988 | Dohan et al. |
| 4,767,429 A | 8/1988 | Fleming et al. |
| 4,775,401 A | 10/1988 | Fleming et al. |
| 5,076,654 A | 12/1991 | Presby |
| 5,080,962 A | 1/1992 | Hench |

(Continued)

FOREIGN PATENT DOCUMENTS

JP        11 202143    *  7/1999  .................. 385/14

(Continued)

OTHER PUBLICATIONS

"Sol-gel integrated optical coupler by ultraviolet light imprinting" By LI C-Y et al. Electronics Letters, IEE Stevenage, GB vol. 31 No. 4, pp. 271-272 dated Feb. 16, 1995.*

(Continued)

Primary Examiner—Akm Enayet Ullah
(74) Attorney, Agent, or Firm—Andrew F. Sayko, Jr.

(57) ABSTRACT

An optoelectronic device having a flexible substrate and an optical interconnect (i.e. waveguide) comprising a sol-gel based material formed on the substrate. The sol-gel based waveguide is capable of being integrated into an all-optical system and provides for greater interconnect distance and lower signal loss. Other sol-gel based optical devices, such as filters, optical source, detectors, sensors, switches and the like, will be implemented in conjunction with the sol-gel based waveguides to provide for an integrated optical system. Methods of formulating the sol-gel based material and methods for fabricating the sol-gel based devices are also provided.

17 Claims, 23 Drawing Sheets

U.S. PATENT DOCUMENTS

| | | | |
|---|---|---|---|
| 5,082,341 A | 1/1992 | Walker | |
| 5,091,983 A | 2/1992 | Lukosz | |
| 5,122,305 A * | 6/1992 | Ashley et al. | 252/646 |
| 5,122,894 A | 6/1992 | Grantham | |
| 5,123,940 A | 6/1992 | DiGiovanni et al. | |
| 5,157,747 A | 10/1992 | Aktins et al. | |
| 5,157,756 A | 10/1992 | Nishimoto | |
| 5,171,344 A | 12/1992 | Noda | |
| 5,224,195 A | 6/1993 | Yoshida et al. | |
| 5,238,877 A | 8/1993 | Russell | |
| 5,238,880 A | 8/1993 | Inami et al. | |
| 5,249,195 A * | 9/1993 | Feldman et al. | 372/45 |
| 5,250,096 A * | 10/1993 | Bruce et al. | 65/390 |
| 5,254,148 A | 10/1993 | Inami et al. | |
| 5,259,046 A | 11/1993 | DiGiovanni et al. | |
| 5,265,185 A | 11/1993 | Ashley | |
| 5,267,336 A | 11/1993 | Sriram et al. | |
| 5,314,518 A | 5/1994 | Ito et al. | |
| 5,334,551 A | 8/1994 | Komatsu | |
| 5,343,542 A | 8/1994 | Kash et al. | |
| 5,344,475 A | 9/1994 | Bhandarkar et al. | |
| 5,356,447 A | 10/1994 | Bhandarkar | |
| 5,363,398 A * | 11/1994 | Glass et al. | 372/92 |
| 5,364,427 A | 11/1994 | Fleming, Jr. | |
| 5,369,722 A | 11/1994 | Heming et al. | |
| 5,375,184 A | 12/1994 | Sullivan | |
| 5,378,256 A | 1/1995 | Green et al. | |
| 5,381,506 A | 1/1995 | Amick et al. | |
| 5,400,788 A | 3/1995 | Dias et al. | |
| 5,404,412 A | 4/1995 | Seino et al. | |
| 5,411,565 A * | 5/1995 | Cognolato et al. | 65/386 |
| 5,416,866 A | 5/1995 | Sahlén | |
| 5,420,947 A | 5/1995 | Li et al. | |
| 5,428,695 A | 6/1995 | Ohta | |
| 5,448,659 A | 9/1995 | Tsutsui et al. | |
| 5,465,312 A | 11/1995 | Maxwell et al. | |
| 5,469,525 A | 11/1995 | Luther-Davies et al. | |
| 5,473,722 A | 12/1995 | Sohler et al. | |
| 5,475,771 A | 12/1995 | Hosoi | |
| 5,480,687 A * | 1/1996 | Heming et al. | 427/573 |
| 5,485,540 A | 1/1996 | Eda | |
| 5,488,955 A | 2/1996 | Dias et al. | |
| 5,498,444 A | 3/1996 | Hayes et al. | |
| 5,504,772 A * | 4/1996 | Deacon et al. | 372/102 |
| 5,521,992 A | 5/1996 | Chun et al. | |
| 5,529,595 A | 6/1996 | Ueki et al. | |
| 5,533,156 A | 7/1996 | Maxwell et al. | |
| 5,537,497 A | 7/1996 | Nelson | |
| 5,544,268 A | 8/1996 | Bischel et al. | |
| 5,559,912 A | 9/1996 | Agahi et al. | |
| 5,561,732 A | 10/1996 | Gergely | |
| 5,562,752 A | 10/1996 | Fleming, Jr. | |
| 5,572,619 A | 11/1996 | Maruo et al. | |
| 5,578,845 A | 11/1996 | Masuda et al. | |
| 5,617,499 A | 4/1997 | Brueck et al. | |
| 5,622,750 A | 4/1997 | Kilian et al. | |
| 5,623,568 A | 4/1997 | Khan et al. | |
| 5,630,004 A | 5/1997 | Deacon et al. | |
| 5,634,955 A | 6/1997 | Araujo et al. | |
| 5,636,309 A | 6/1997 | Henry et al. | |
| 5,647,036 A | 7/1997 | Deacon et al. | |
| 5,659,010 A | 8/1997 | Sotoyama et al. | |
| 5,659,332 A | 8/1997 | Ishii et al. | |
| 5,664,032 A | 9/1997 | Bischel et al. | |
| 5,675,691 A | 10/1997 | Edlinger et al. | |
| 5,680,497 A | 10/1997 | Seino et al. | |
| 5,694,513 A | 12/1997 | Okaniwa | |
| 5,708,280 A * | 1/1998 | Lebby et al. | 257/88 |
| 5,724,463 A | 3/1998 | Deacon et al. | |
| 5,732,177 A | 3/1998 | Deacon et al. | |
| 5,745,617 A | 4/1998 | Starodubov et al. | |
| 5,761,353 A | 6/1998 | Van Der Tol et al. | |
| 5,768,462 A | 6/1998 | Monet | |
| 5,778,112 A | 7/1998 | Hwang et al. | |
| 5,783,319 A | 7/1998 | Reisfeld et al. | |
| 5,784,517 A | 7/1998 | Johanson | |
| 5,785,874 A | 7/1998 | Eda et al. | |
| 5,790,580 A | 8/1998 | Sakata et al. | |
| 5,805,743 A | 9/1998 | Iwamoto et al. | |
| 5,805,774 A | 9/1998 | Viot et al. | |
| 5,821,571 A * | 10/1998 | Lebby et al. | 257/98 |
| 5,835,458 A | 11/1998 | Bischel et al. | |
| 5,841,929 A | 11/1998 | Komatsu et al. | |
| 5,845,025 A | 12/1998 | Garito et al. | |
| 5,846,694 A | 12/1998 | Strand et al. | |
| 5,852,702 A | 12/1998 | Nishida et al. | |
| 5,854,868 A | 12/1998 | Yoshimura et al. | |
| 5,859,943 A | 1/1999 | Asakura et al. | |
| 5,861,113 A | 1/1999 | Choquette et al. | |
| 5,881,083 A * | 3/1999 | Diaz-Garcia et al. | 372/39 |
| 5,881,186 A | 3/1999 | Starodubov et al. | |
| 5,887,089 A * | 3/1999 | Deacon et al. | 385/22 |
| 5,890,789 A | 4/1999 | Inagaki et al. | |
| 5,894,538 A | 4/1999 | Presby | |
| 5,911,018 A | 6/1999 | Bischel et al. | |
| 5,912,997 A | 6/1999 | Bischel et al. | |
| 5,923,694 A | 7/1999 | Culver et al. | |
| 5,937,129 A | 8/1999 | Jeong et al. | |
| 5,937,133 A | 8/1999 | Moss et al. | |
| 5,940,568 A | 8/1999 | Lösch | |
| 5,953,469 A | 9/1999 | Zhou et al. | |
| 5,972,516 A | 10/1999 | Kaneko et al. | |
| 5,978,524 A | 11/1999 | Bischel et al. | |
| 6,011,641 A | 1/2000 | Shin et al. | |
| 6,022,671 A | 2/2000 | Binkley et al. | |
| 6,022,760 A * | 2/2000 | Lebby et al. | 438/123 |
| 6,023,545 A | 2/2000 | Eldada et al. | |
| 6,039,897 A | 3/2000 | Lochhead et al. | |
| 6,047,568 A | 4/2000 | Campion | |
| 6,067,186 A | 5/2000 | Dalton et al. | |
| 6,072,925 A | 6/2000 | Sakata | |
| 6,078,704 A | 6/2000 | Bischel et al. | |
| 6,078,705 A | 6/2000 | Neuschafer et al. | |
| 6,081,632 A | 6/2000 | Yoshimura et al. | |
| 6,088,492 A | 7/2000 | Kaneko et al. | |
| 6,091,870 A | 7/2000 | Eldada | |
| 6,091,874 A | 7/2000 | Higashi et al. | |
| 6,097,865 A | 8/2000 | Alferness et al. | |
| 6,097,871 A | 8/2000 | De Dobbelaere et al. | |
| 6,118,908 A | 9/2000 | Bischel et al. | |
| 6,122,416 A | 9/2000 | Ooba et al. | |
| 6,128,253 A | 10/2000 | Goldstein et al. | |
| 6,145,342 A * | 11/2000 | Bayya et al. | 65/17.2 |
| 2002/0048289 A1* | 4/2002 | Atanackovic et al. | 372/20 |

FOREIGN PATENT DOCUMENTS

JP    11 202143 A    7/1999

OTHER PUBLICATIONS

Jerome Porque; Paul Coudray; Yves Moreau; Pascal Etienne; *Propagation in Sol-Gel Channel Waveguides: numerical and experimental approaches*; Optical Engineering; Apr. 1998; pp. 1105-1110; vol. 37, No. 4; Society of Photo-Optical Instrumentation Engineers; Bellingham, US; ISSN: 0091-3286; XP00771669.

C.-Y. Li, J. Chisham, M. Andrews, S.I. Najafi, J.D. Mackenzie, N. Peyghambarian; *Sol-gel integrated optical coupler by ultraviolet light imprinting*; Electronics Letters; Feb. 1995; pp. 271-272; vol. 31, No. 4; IEE Stevenage, GB; ISSN: 0013-5194; XP006002424.

M.A. Fardad, M.P. Andrews, S.I. Najafi; *Novel sol-gel fabrication of integrated optical waveguides*; Integrated

*Optics Devices: Potential for commercialization, San Jose, CA, USA*; Feb. 1997; pp. 72-78; vol. 2997; Proceedings of the SPIE—The International Society for Optical Engineering, 1997, SPIE-Int. Soc. Opt. Eng, USA; ISSN: 0277-786X; XP001039942.

P. Coudray, J. Chisham, A. Malek-Tabrizi, C.-Y. Li, M.P. Andrews, N. Peyghambarian, S.I. Najafi; *Ulraviolet light imprinted sol-gel silica glass waveguide devices on silicon; Optics Communications*; Jul. 1996; pp. 19-22; vol. 128, No. 1; North-Holland Publishing Co.; Amsterdam, NL; ISSN: 0030-4018; XP004018500.

M.A. Fardad, M. Fallahi; *Organic-inorganic materials for integrated optoelectronics; Electronics Letters*; Oct. 1998; pp. 1940-1941; vol. 34, No. 20; IEE Stevenage, GB; ISSN: 0013-5194; XP006010399.

C.M. Chan, G.Z. Cao, H. Fong, M. Sarikaya, T. Robinson, L. Nelson; *Organic/Inorganic Hybrid Sol-Gel Derived Hard Coatings on Plastics; Organic/Inorganic Hybrid Materials II, San Francisco, CA, Apr. 5-9, 1999*; Apr. 1999; pp. 319-324; vol. 576; Materials Research Society Symposium Proceedings vol. 576, Warrendale, PA: MRS, US; ISBN 1-55899-483-1; XP000897930.

* cited by examiner

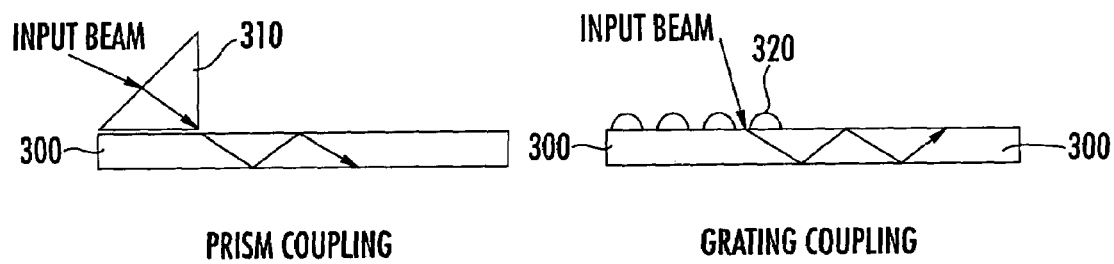
FIG. 4A. PRISM COUPLING
FIG. 4B. GRATING COUPLING

INTEGRATED OPTICAL CIRCUITS

CROSS-REFERENCE TO RELATED APPLICATIONS

The present application claims priority from U.S. Provisional Patent Application Ser. No. 60/194,663, entitled "Integrated Optical Circuits", filed on Apr. 4, 2000, the contents of which are incorporated by reference.

FIELD OF THE INVENTION

The present invention relates to integrated optical circuits and more particularly to devices and systems that integrate sol-gel based optical interconnects with associated optical elements and methods for fabricating integrated sol-gel based optical interconnects.

BACKGROUND OF THE INVENTION

Advances in optical sciences have recently been widely recognized for their impact in the field of communications. These advances have precipitated innovation towards an all-optical network, which includes; sources, modulators, wavelength division multiplexers, amplifiers and functional optical devices. Such an all-optical network would provide increased bandwidth. However, barriers still exist that prevent the total realization of an all-optical network. One key problem for both telecommunications and data communications in an all-optical environment is in the area of integration, i.e. being able to integrate and connect a myriad of optical devices in a confined space. In this regard, the increasing sophistication of the network leads to greater complexity. More network elements—such as multiplexers, de-multiplexers, lasers, modulators, etc.—need to share the limited space available on a substrate or semiconductor chip. Thus, in order to implement a fully optical network, it becomes increasingly important to integrate multiple optical elements on a single substrate/chip in various combinations depending on the application.

The need for hardware to address high-speed data communication and information transfer has prompted the emergence of optical interconnection technology that includes multi-chip module packaging based on free space and guided wave interconnects. Integrated optical interconnection has inherited a mature and compatible technology from microelectronics, and semiconductor lasers. The optical interconnects encompass intra-chip, multichip module, inter-board, and system-to-system level links. A considerable effort has been dedicated towards the development of reliable, high speed and efficient optical links. Several areas have been developed in parallel; for example, surface-emitting semiconductor lasers, both vertical and horizontal cavity laser arrays, high-speed photodetectors, and drive circuitry. For example, 2 Gbs Vertical Cavity Semiconductor Laser (VCSEL) arrays operating at 850 nm and fast photodetectors are commercially available. These interconnections have predominately been made with short optical fibers called "jumpers," or patch cords. However, the increasing density of these cable connections is creating problems in cable management, resulting in incorrect or unidentified connections. Other trouble spots include reliability, cost, and space consumption.

Major advances have been achieved in the technology of fabricating an optical interconnect in polymeric film in recent years. One type of such optical interconnect is an optical waveguide. The optical waveguide formed in a polymeric film is beneficial in providing short distance optical interconnections. While these waveguides have exhibited optical loss of less than about 0.1 dB/cm at a wavelength of about 850 nm, typically, high loss is associated with such optical waveguides particularly at communication wavelengths of about 1300 to about 1600 nm. For this reason their implementation has been limited to relatively short distances. See for example, "Recent Progress in Short Distance Optical Interconnects", J. Bristow et. al., SPIE Vol. 3005, pp. 112–119, 1997.

In addition, one application in which optical interconnections would be desirable is backplane design. While it would be desirable to have a backplane design that is all-optical, the all-optical interface for backplane application does not exist because lasers, photodetectors and the like are formed of different materials. Therefore, the integration and packaging of such backplanes have been and still remain a major challenge. In spite of various successful endeavors, a fully new approach is needed to easily integrate the three main components; the waveguide, the optical source and the optical detector of an optical interconnect unit.

Sol-gel waveguide structures on silica or silicon substrates have been demonstrated previously in the form of discrete passive optical components, such as, wavelength filters or splitters. Due to the physical properties of such substrates, the size of such components is typically small, one inch or so, which is perfectly acceptable for discrete components, but is of no value in backplane applications where the optical paths of interest are tens of inches.

Traditional work in the area of sol-gel based interconnects/waveguides have required high temperature processing and, therefore has resulted in devices having high optical loss. For example, traditional sol-gel based interconnects are typically fabricated in the about 800 to about 1000 degree Celsius range. As such, the underlying substrate is limited to materials that can withstand this high temperature processing, such as glass. Additionally, rare earth ion (erbium, ytterbium, etc.) doping of sol-gel to create active regions within the waveguides has been limited to traditional high temperature processing. See for example, "Fabrication of Highly Concentrated $Er^{3+}$ Doped Aluminosilicate Film Via Sol-Gel Processing", Ryu et. al., Applied Physics Letters, Vol. 66, p. 2497, 1995. In this erbium doped sol-gel application, the post-bake anneal processing involves temperatures ranging from about 650 to about 1050 degrees Celsius. Also, see "Preparation and Characterization of Sol-Gel Derived $Er^{3+}$: $Al_2O_3$—$SiO_2$ Planar Waveguides", Benatsou et. al., Applied Physics Letters, Vol. 71, p. 428, 1997. In a similar fashion, this erbium doped sol-gel application requires post-bake annealing at temperatures in the range of about 900 to about 1100 degrees Celsius.

Recently, the use of hybrid materials (i.e. sol-gel and polymer combinations) has resulted in sol-gel based interconnects capable of being formed using conventional microelectronic fabrication techniques, such as conventional photolithography. For an example of such hybrid materials see, "Sol-Gel Waveguide Fabrication Parameters: An Experimental Investigation", Du et. al., Journal of Optical Engineering, Vol. 37, pp. 1101–1104, 1998. However, the resulting interconnects result in optical loss greater than about 2.0 dB/cm. This degree of optical loss can be attributed to the processing temperatures that are characteristically in excess of the glass transition temperature of the sol-gel based material. Additionally, the hybrid materials do not lend themselves to conventional doping processes; i.e., ion implantation and the like.

Conventional optical waveguides have been implemented in many applications, such as sensor applications. See for example, "Integrated Optical Sensors Based on Reactive Low Voltage Ion Plated Films", Kunz et al., Eurosensors IV, Karlsruhe, 1990. These sensors are produced with a reactive ion plating of $Ta_3O_5$ and exhibit a refractive index of about 2.2 at a loss of about 1.1 dB/cm for $TE_0$ mode and about 1.3 dB/cm for $TM_0$ mode. This type of sensor resides in a substrate and is, therefore, limited in that it cannot be properly integrated in the composite optoelectronic structure that it functions along side. In another application glass waveguides formed in organic substrates have been developed for sensor applications. See for example, U.S. Pat. No. 5,480,687, entitled "Optical Waveguide with a Substantially First Substrate and a Process for its Production", issued on 2 Jan. 1996, in the name of inventors, Heming, et al. The waveguides disclosed in the Heming '687 patent are limited in that they exhibit attenuation loss of about 5 dB/cm. The industry desire is to provide for waveguides and optical sensing units with attenuation loss approaching a totally loss-less device.

As capacity demands escalate in the high-speed data communication industries, service providers face competitive pressure to deliver data at the lowest cost per bit per kilometer, rapidly provision new services, and reconfigure bandwidth to meet customer requirements. Presently, data communication industries are experiencing explosive growth in the demand to transport large volumes of data. This demand is largely the result of the impact of Internet and multimedia communication for business, education, and recreation. Not only are the numbers of users increasing rapidly, but the per-user demand for bandwidth is increasing with computer technology advances as well. At present, the standard bandwidth for an optical fiber communication link is 2.5 Gbit/s. Some systems of 40 Gbit/s are beginning to be deployed at present, but predictions expect that systems operating at more than 1 Tbit/s will be required in the near future.

Wavelength division multiplexing (WDM), in which data is transmitted at a lower bit rate, over multiple wavelengths or channels is one solution to this problem. For example, sending signals having four different wavelengths (channels) through the same fiber each at 2.5 Gbit/s would increase the system bandwidth to 10 Gbit/s. In recent years, 8- and 40-channel and even 80-channel DWDM (Dense WDM) systems have become commercially available, thus paving the way for DWDM deployment. However in known DWDM systems, the number of channels may be limited due to the limited gain bandwidth of Erbium Doped Fiber Amplifiers (EDFAs) and the problems inherent with wavelength-selective Distributed Bragg Reflector (DBR) lasers.

Due to these bandwidth limitations current optical-to-electrical-to-optical techniques will have difficulty meeting the needs of this new network. In the future, many network functions will take place in the emerging optical layer. The functions will require all-optical-network elements such as, add/drop filters, switches that, in conjunction with DWDM, will revolutionize communications networks. All-optical network elements will eliminate bottlenecks and create more service delivery options.

Early work in the area of integrated optics focused on known theoretical concepts established previously in the microwave field. In this regard, early technological advancements centered on developing and demonstrating devices that were compatible with rudimentary integrated optical technology. The distributed feedback (DFB) laser demonstrated by Kogelnik and Shank in 1972 was a milestone along this path. A wide variety of passive optical components such as optical directional couplers, Y-branches, waveguide crossings, acousto-optical filters, Bragg gratings, transmission gratings, optical switches and modulators were also demonstrated around that time. A 4-channel WDM transmitter represented the first attempt to realize integrated optical circuits for telecommunications.

Today, the technology of integrated optics has attained a high degree of maturity. Most of the integration applications have used materials such as indium-gallium-arsinide-phosphorus (InGaAsP), gallium-aluminum-arsinide (GaAlAs), lithium niobate ($LiNbO_3$) and glass. InGaAsP/InP systems allow for monolithic integration in the 1.3/1.5 μm region, which is widely known to represent the attenuation window for glass fibers. The waveguide structures from this materials system are formed by epitaxy and dry etching. GaAlAs/GaAs systems allow for monolithic integration in the 0.8 μm region, which is the wavelength widely used for short-range connections for telecommunications. Lithium niobate is an anisotropic material with high electro-optical and acousto-optical coefficients; however, the resulting devices have significant polarization dependence.

Integrated optics technology is already finding wide applications in telecommunications and computer technology, and one can confidently expect that in the near future concepts like waveguides and optical network will have firmly entered the household usage. The developments of this future technology are still being carried out and improvements in this area include the need to develop integrated components and devices that minimize space consumption on the chip/substrate and accomplish this task in a cost effective manufacturing environment.

SUMMARY OF THE INVENTION

A class of sol-gel based optical components, devices and subsystems are therefore provided that benefit from fabrication techniques that allow complex optical circuitry to be integrated in an all-optical environment. By leveraging emerging MEMS technology, devices can be readily fabricated in large volume using photolithography techniques that provide for intricate integrated circuitry. Such devices will be instrumental in addressing the demands of future telecommunications and data communications.

In one embodiment of the present invention, an optoelectronic device is defined as including a flexible substrate and an optical interconnect (i.e. waveguide) comprising a sol-gel based material formed on the flexible substrate. The flexible substrate will typically comprise a polymeric material. The sol-gel based material may comprise a pre-hydrolyzed silica sol-gel, such as Methacryloxypropyltrimethoxysilane (MAPTMS) or the like. To minimize optical loss in the resulting waveguides the pre-hydrolyzed silica sol-gel is synthesized in an aqueous-free and alcohol-free environment to provide for processing temperatures during device fabrication that are below the glass transition temperature of the sol-gel based material. In one embodiment of the invention, the optical waveguide will include an active region that is characteristically optically pumped by optical sources having a suitable wavelength of absorption. The active region may be defined by rare earth ion dopants having transition lines in the about 0.2 micron to about 3.0 micron spectrum when illuminated by optical pumping means having a generally suitable wavelength. In specific embodiments the rare earth ions may include, alone or a combination of erbium, ytterbium and neodymium ions or the like. The sol-gel based waveguide provides for an interconnect that may be optically side-pumped or end-pumped depending on the appropriate application. In addition, the waveguides may incorporate Bragg grating structures or prisms to facilitate wavelength selection.

In a further embodiment of the invention an array of optical interconnects (i.e., array waveguides (AWG)) is provided including a flexible substrate and a plurality of optical interconnects disposed in a predetermined pattern on the flexible substrate. The optical interconnects or waveguides comprise a sol-gel based material. The waveguides in the array may include point-to-point waveguides, point-to-multipoint, multipoint-to-multipoint waveguides or a combination thereof.

Additionally the invention is encompassed in an optoelectronic system including a substrate, an optical interconnect comprising a sol-gel based material formed on the substrate and at least one optical source in optical communication with the optical interconnect that is used to pump an active region of the optical interconnect. In one embodiment of this aspect of the invention the optical source will comprise the sol-gel based material so that the composite optoelectronic system may result in a monolithic integrated optical system. The optical source may comprise vertical cavity surface emitting lasers (VCSEL), fiber lasers, waveguide lasers or the like. Characteristically the resulting waveguide structures may be optically side-pumped or end-pumped depending on the application. Typically, the optoelectronic systems will include an optical detector for detecting an optical signal within the optical interconnect. In most instances the detector may also be fabricated from a sol-gel based material. Grating structures and/or prisms may be implemented on the waveguides to facilitate wavelength selection coming from the optical source or leading to the optical detector.

The optoelectronic device of the present invention may also be defined in terms of the layering of the device during fabrication. In such an embodiment, a flexible substrate will have disposed thereon a first cladding layer comprising a first sol-gel based material, a core layer disposed on the first cladding layer comprising a second sol-gel based material that will have a higher refractive index than the sol-gel based material used to form the first cladding layer and a second cladding layer disposed on the core layer and the first cladding layer. The second cladding layer is comprised of the first sol-gel based material. In this arrangement the device is typically formed as a ridge or buried waveguide on the surface of the substrate. Alternatively, the waveguide may be formed as a surface waveguide. Such as surface waveguide would be defined as having a flexible substrate and a sol-gel based layer disposed on the flexible substrate. The sol-gel based layer has a core region of a first refractive index and a cladding region, adjacent to the core region, of a second refractive index.

The invention is also embodied in an optoelectronic device having a substrate with first and second optical interconnects disposed thereon. The optical interconnects comprise a sol-gel based material. The second optical interconnect is disposed on the substrate so as to be generally parallel to the first optical. A first coupling region is formed comprising an area in which the first and second optical interconnects come into close proximity to one another so as to facilitate optical coupling. The first and second optical interconnects are generally in a Michelson interferometer configuration and provide for an optical sensor. Bragg grating structures may be formed on an arm of one or both optical interconnects to provide for an optical switch or, in the instance where the gratings are chirped, a dispersion compensation filter. Additionally, the Bragg grating structures may be formed on a port of either interconnect and provide for an optical circulator. By providing for fixed Bragg grating structures in the arms of the first and second optical interconnects an add/drop filter may also be realized. In an alternate embodiment, the optoelectronic device comprises a second coupling region comprising another area in which the first and second optical interconnects come into close proximity to one another so as to facilitate optical coupling. In the instance where two coupling regions are provided for the first and second optical interconnects, the optoelectronic device is in Mach-Zehnder interferometer configuration.

Alternate embodiments of the invention are found in tunable laser devices and associated arrays, drop/add filters, optical circulators and dispersion compensation filters. These embodiments incorporate an optical interconnect comprising sol-gel based material formed on a flexible substrate.

In yet another embodiment of the present invention, multi-dimensional optoelectronic devices are provided. The multi-dimensional device comprises a flexible substrate, a first optical interconnect formed on the first surface of the flexible substrate in a first plane of orientation and comprise a sol-gel based material and a second optical interconnect formed in a second plane of orientation above the first plane of orientation, the second optical interconnect also comprises a sol-gel based material. In a typical arrangement four interconnects, two disposed in a first horizontal plane and two disposed in a second horizontal plane with respect to the substrate will be arranged so as to come into close proximity to act as an optical coupler. Additionally, the interconnects may be arranged in any three dimensional configuration, such as a star-like configuration, in order to facilitate the required amount of power transfer during coupling. Thus, the multi-dimensional optoelectronic devices permit the coupling between the optical interconnects to be tailored as desired for a particular application.

BRIEF DESCRIPTION OF THE DRAWINGS

Figure 1:
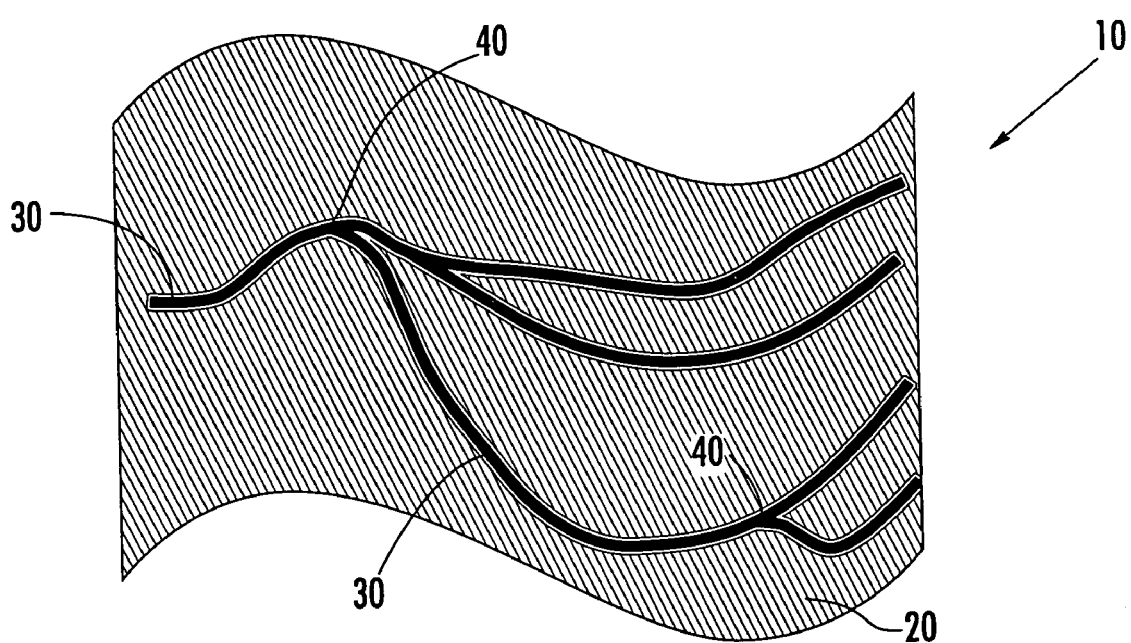

Having thus described the invention in general terms, reference will now be made to the accompanying drawings, which are not necessarily drawn to scale, and wherein:

FIG. 1 is a perspective view of flexible substrate having sol-gel based waveguides disposed therein, in accordance with an embodiment of the present invention.

FIGS. 2A–2F are cross sectional diagrams of various stages in the fabrication process of a ridge or buried sol-gel based waveguide on flexible substrate, in accordance with an embodiment of the present invention.

FIGS. 3A–3D are cross-sectional diagrams of various stages in the fabrication of a surface sol-gel based waveguide on a flexible substrate, in accordance with an embodiment of the present invention.

FIGS. 4A and 4B are cross-sectional diagrams of sol-gel based waveguides incorporating prisms and gratings as coupling mechanisms, in accordance with an embodiment of the present invention.

Figure 5:
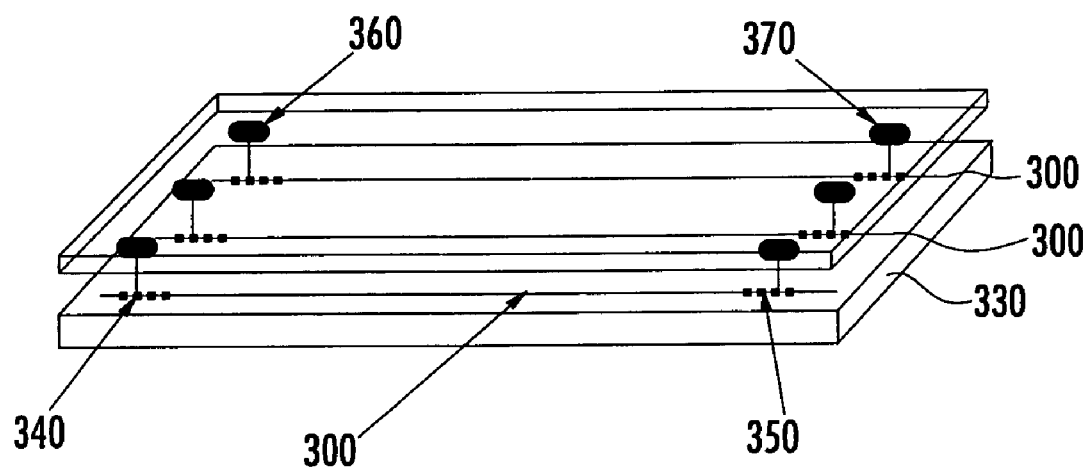

FIG. 5 is a perspective view schematic diagram of an optical backplane incorporating sol-gel based waveguides, grating couplings, optical sources and optical detectors, in accordance with an embodiment of the present invention.

Figure 6:
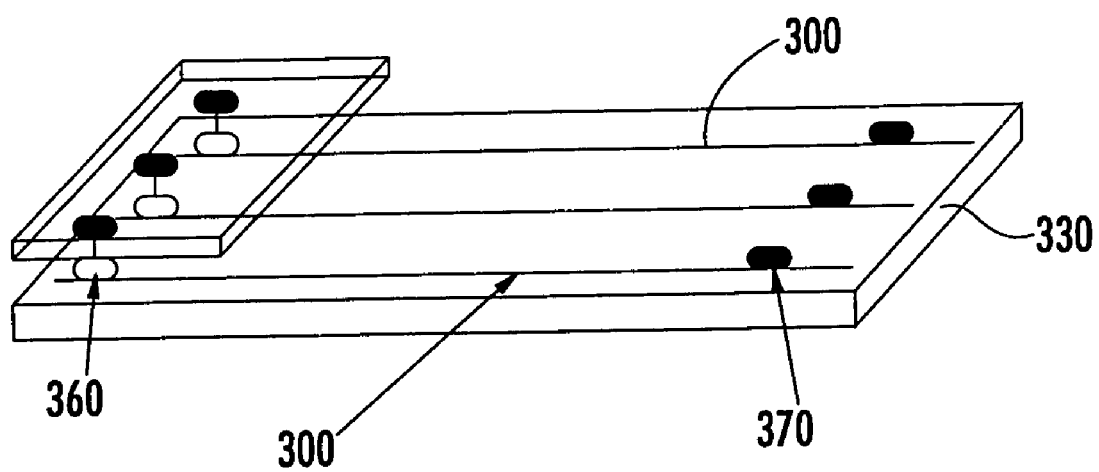

FIG. 6 is a perspective view schematic diagram of an optical backplane system incorporating sol-gel based waveguides, optical sources, optical detectors and pumped optical sources, in accordance with an embodiment of the present invention.

Figure 7A:
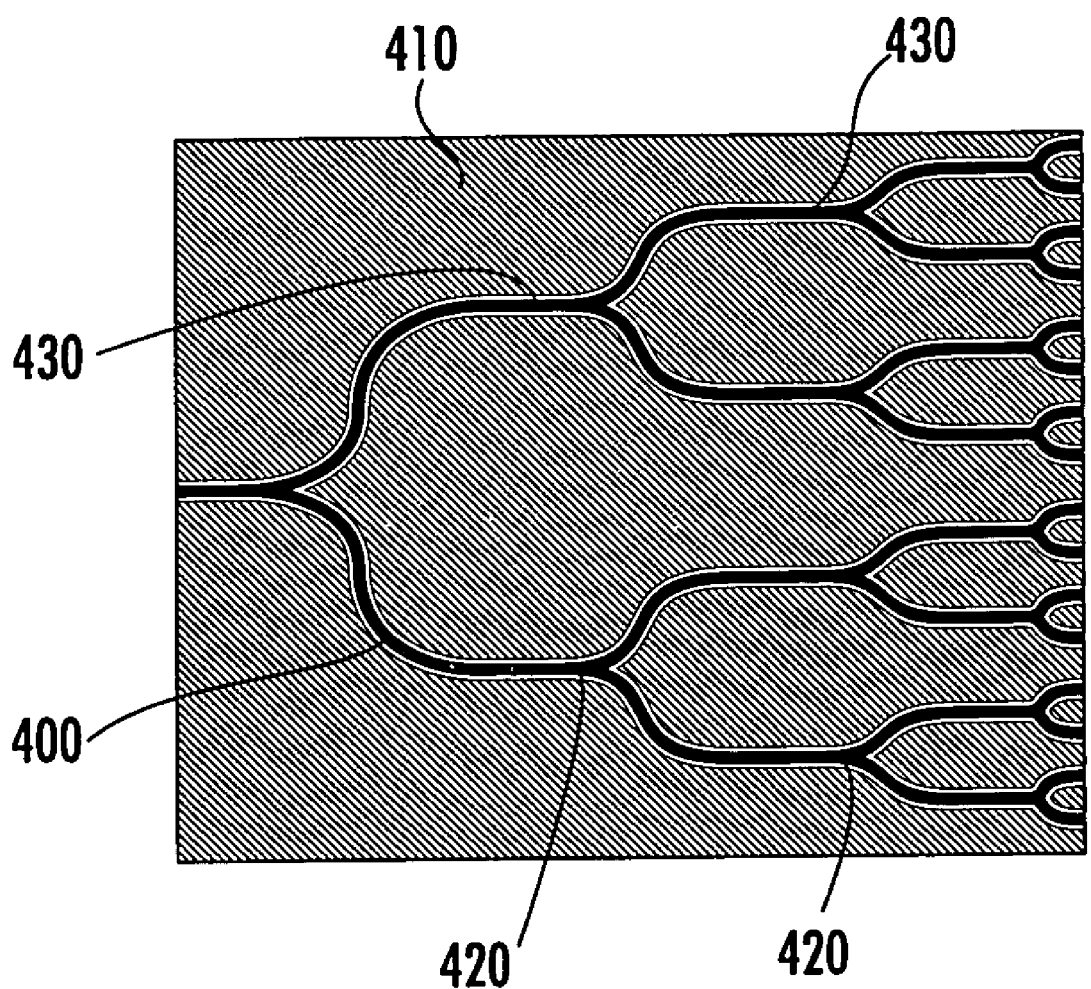

FIG. 7A is a plan view diagram of a flexible substrate having sol-gel waveguides disposed therein with multiple splitters and amplifiers, in accordance with an embodiment of the present invention.

Figure 7B:
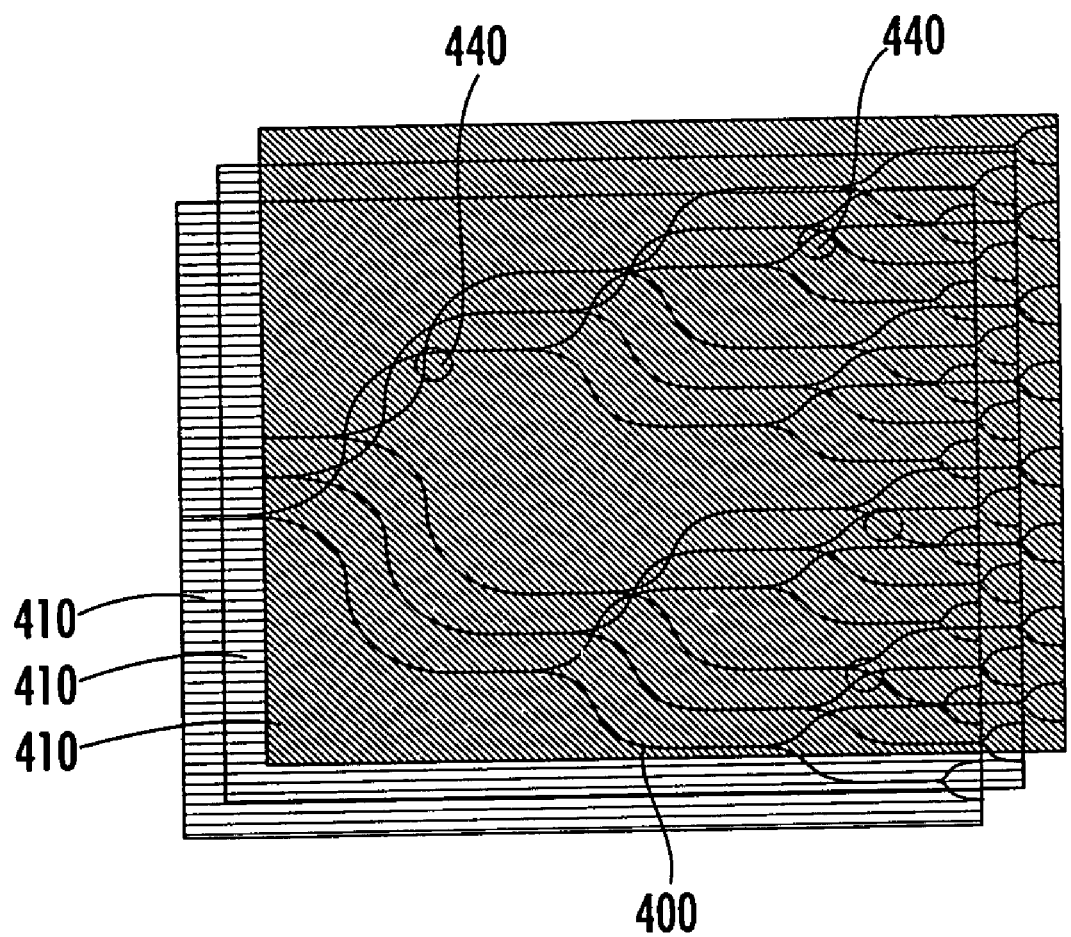

FIG. 7B is a plan view diagram of a multi-layered optoelectronic system having sol-gel waveguides disposed therein with multiple splitters, and multi-layered couplers, in accordance with an embodiment of the present invention.

Figure 8:
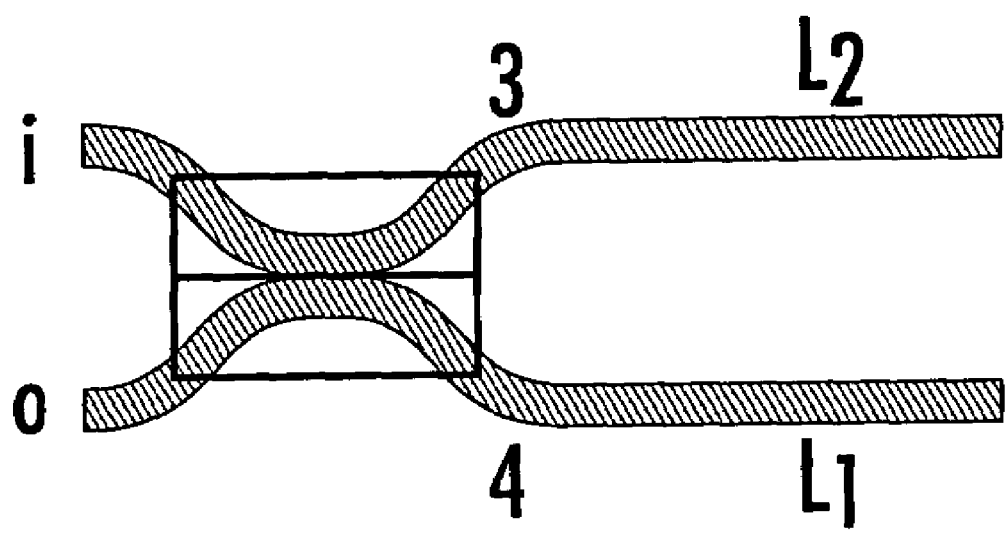

FIG. 8 is a simplified schematic diagram of sol-gel waveguides formed in Michelson interferometer configuration, in accordance with an embodiment of the present invention.

Figure 9:
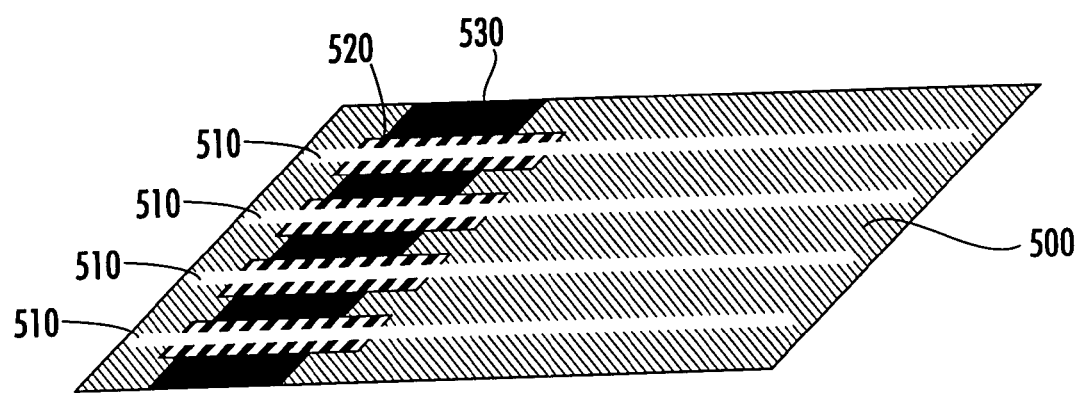

FIG. 9 is a perspective view schematic diagram of a tunable laser array having sol-gel based waveguides, in accordance with an embodiment of the present invention.

Figure 10:
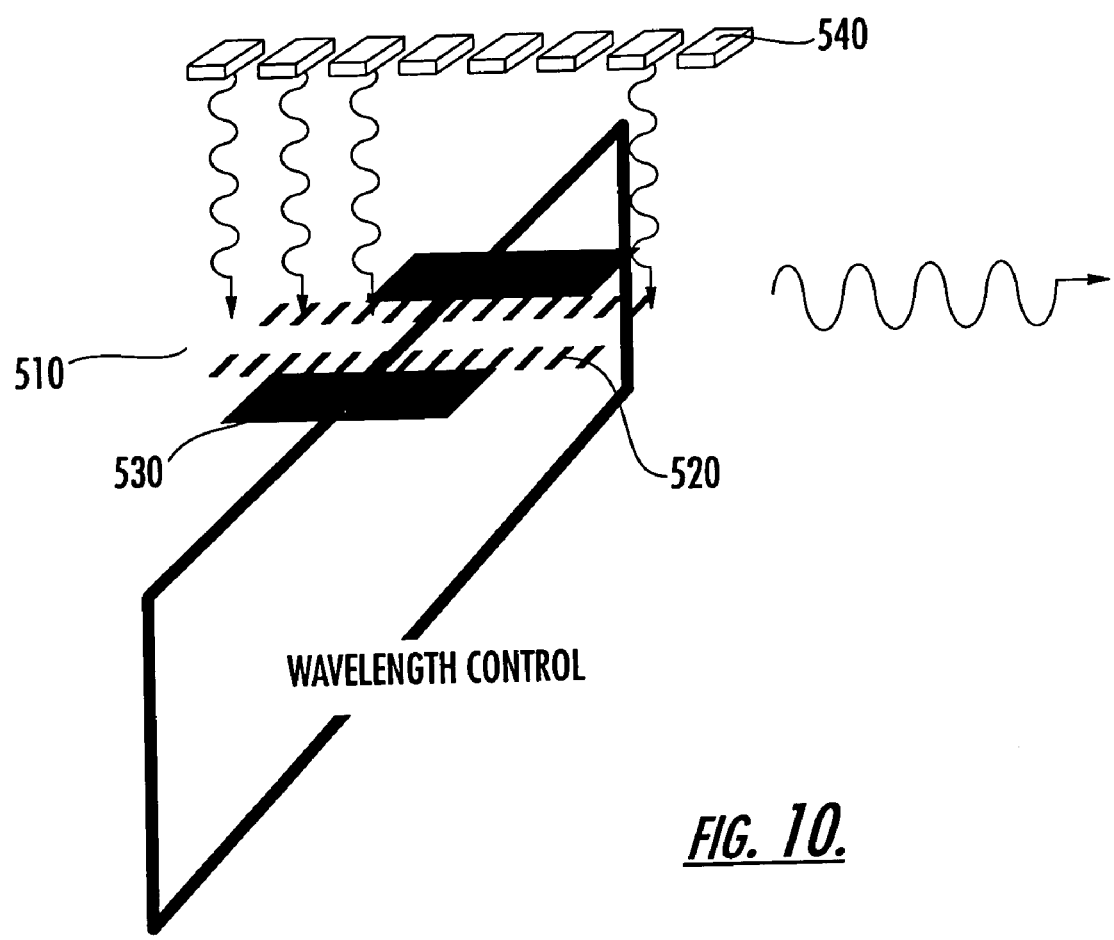

FIG. 10 is a perspective view schematic diagram of a tunable laser array being side pumped by an external optical source, in accordance with an embodiment of the present invention.

Figure 11:
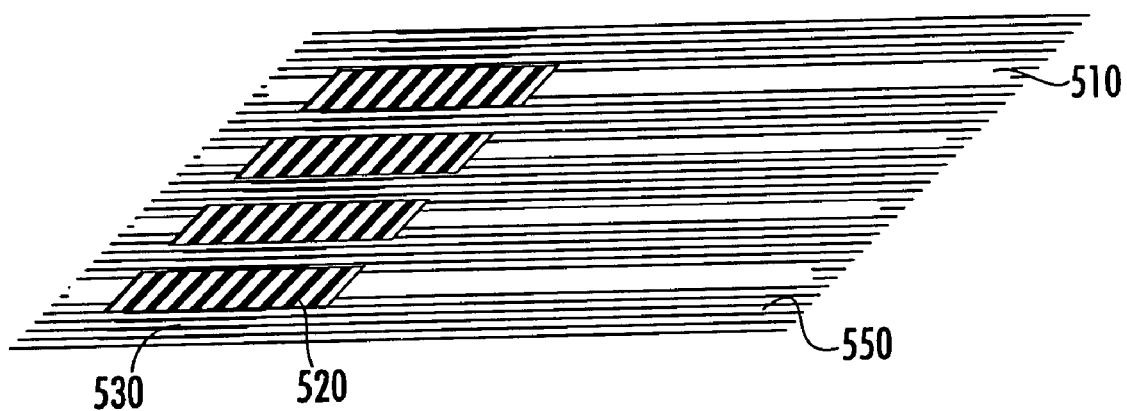

FIG. 11 is a perspective view schematic diagram of a tunable laser array having sol-gel based waveguides in which the external optical source is in close proximity to the tunable laser array, in accordance with an embodiment of the present invention.

Figure 12:
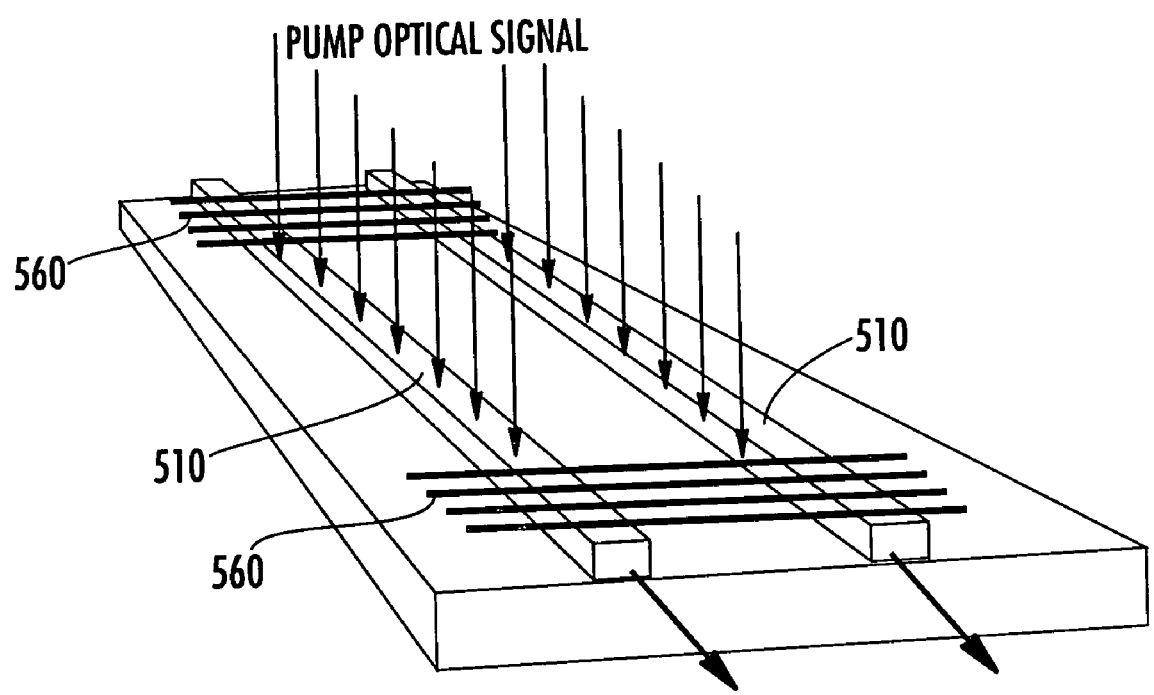

FIG. 12 is perspective view schematic diagram of a Distributed Bragg reflector array incorporating sol-gel based waveguides, in accordance with an embodiment of the present invention.

Figure 13:
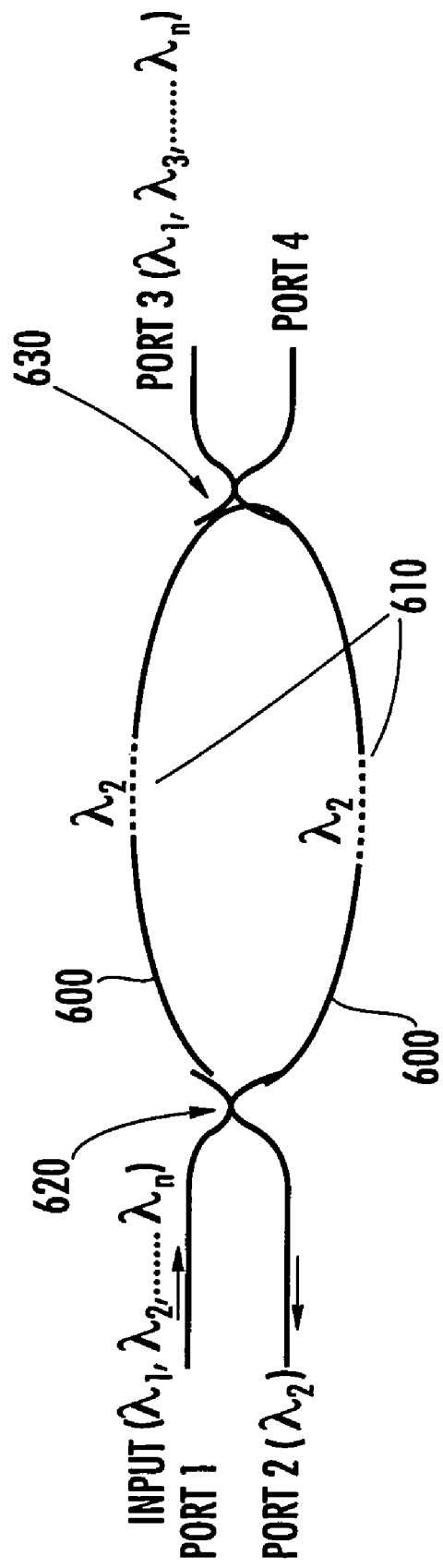

FIG. 13 is a schematic diagram of a drop/add filter having a Mach-Zehnder interferometer configuration and incorporating sol-gel based waveguides and fixed gratings, in accordance with an embodiment of the present invention.

Figure 14:
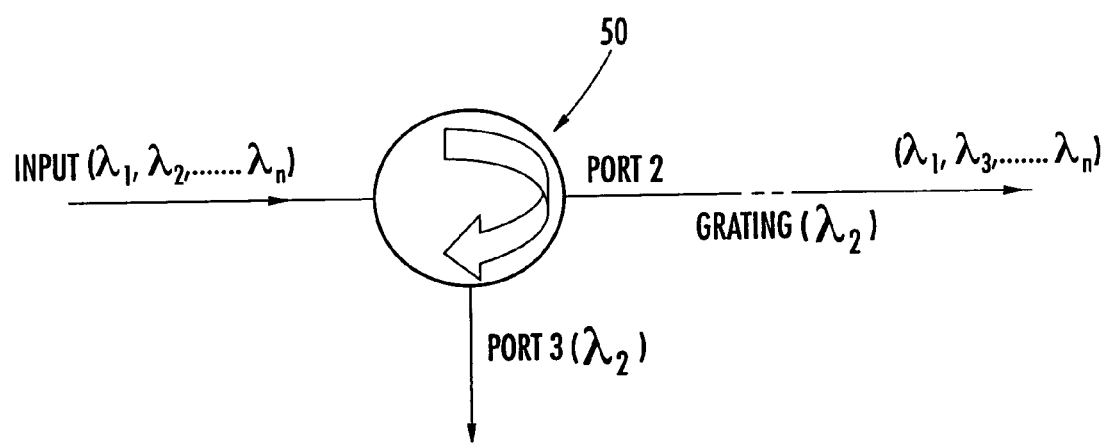

FIG. 14 is a schematic diagram of an optical circulator incorporating sol-gel based waveguides and grating structures formed on the port of the waveguide.

FIGS. 15A–15D is a cross-sectional diagram illustrating coupling options for a three-dimensional optical coupler incorporating sol-gel based waveguides, in accordance with an embodiment of the present invention.

Figure 16:
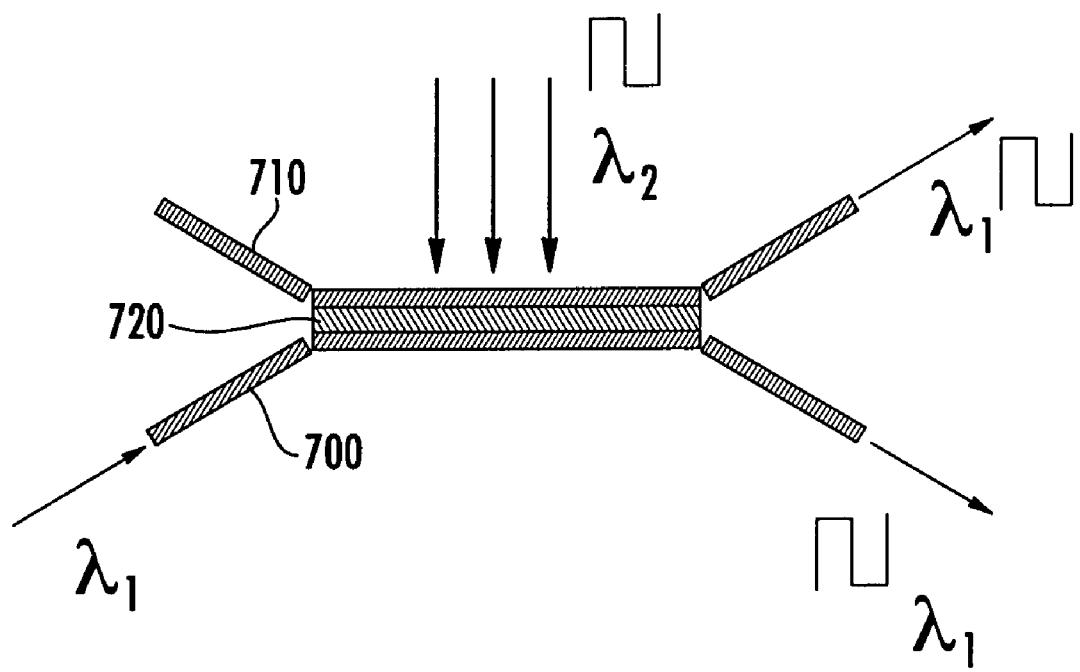

FIG. 16 is a schematic diagram illustrating the switching action implemented by side pumping the coupled region of a multi-dimensional coupler, in accordance with an embodiment of the present invention.

Figure 17:
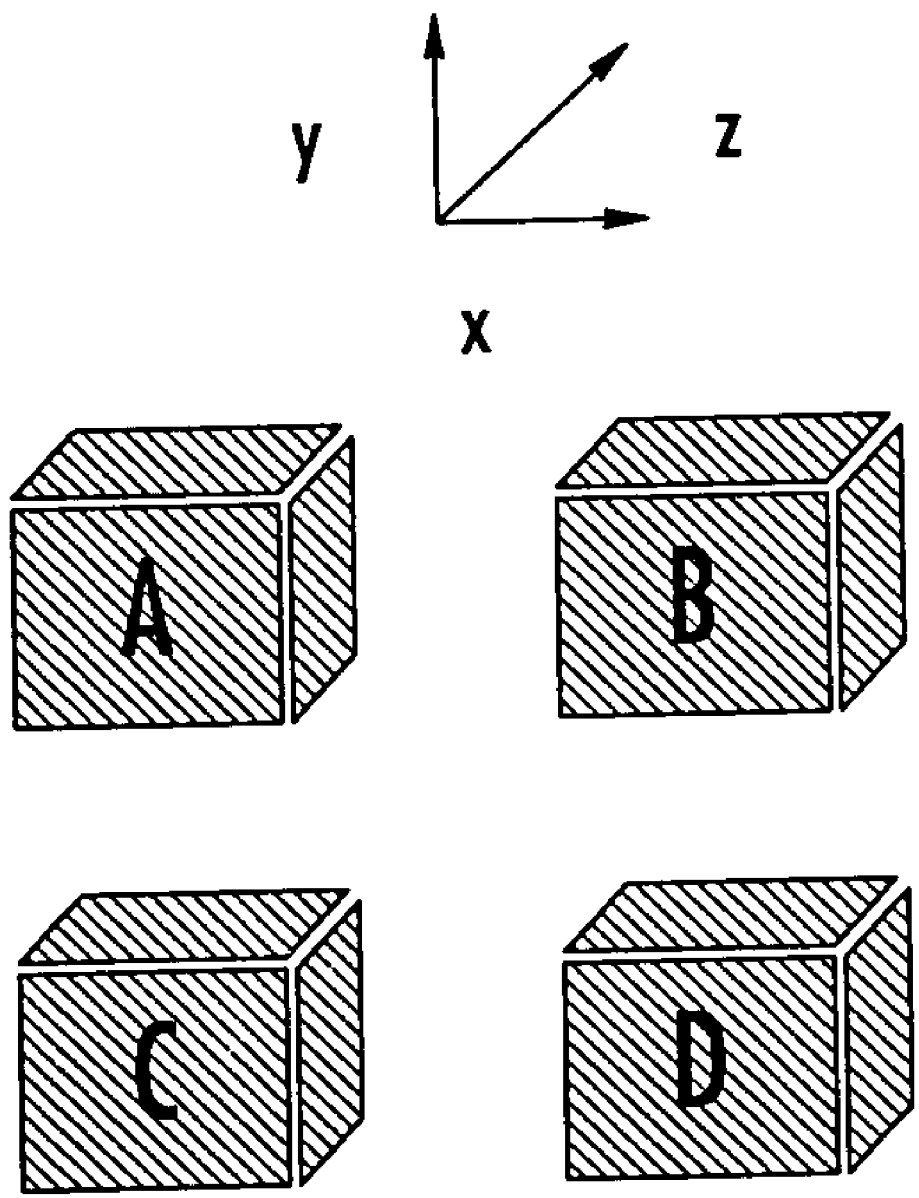

FIG. 17 is a perspective view schematic diagram of a 4×4 three dimensional optical coupler incorporating sol-gel based waveguides, in accordance with an embodiment of the present invention.

Figure 18:
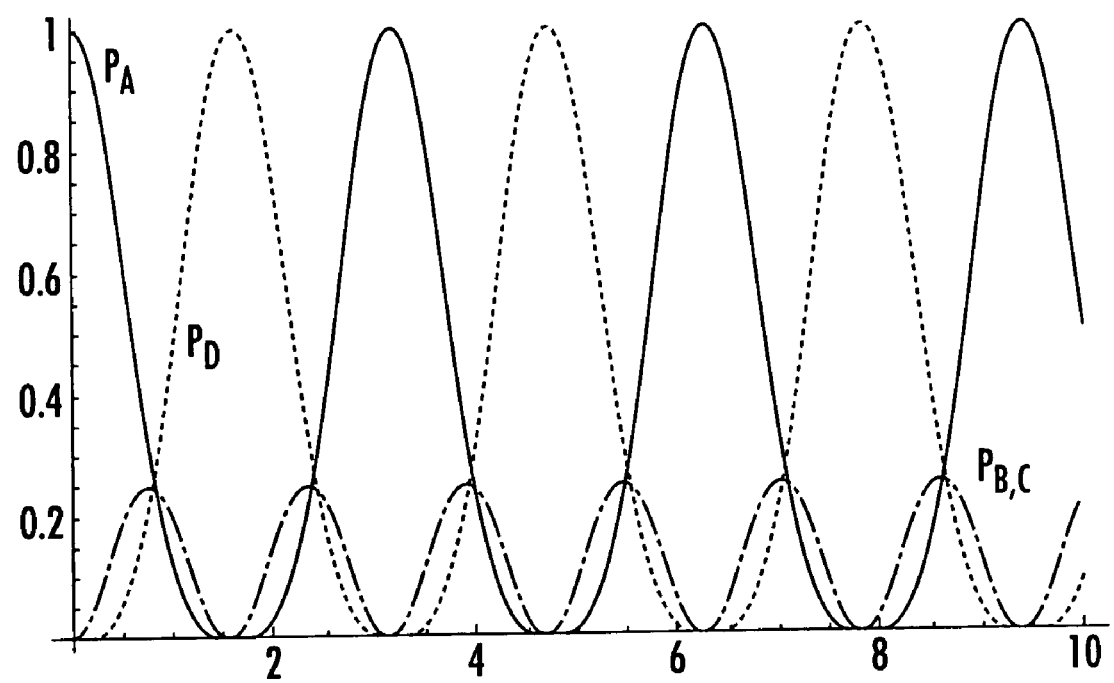

FIG. 18 is graphical representation of the power transfer amongst the four waveguides in a symmetric 4×4 three-dimensional optical coupler having light launched into one waveguide, in accordance with an embodiment of the present invention.

Figure 19:
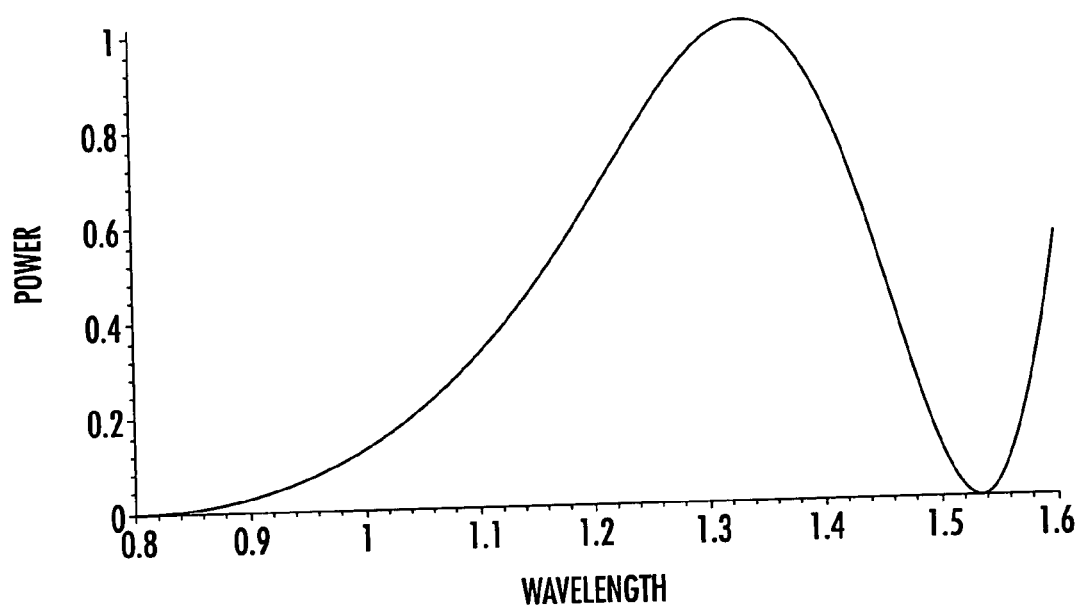

FIG. 19 is a graphical representation of power transfer versus wavelength in a symmetric 4×4 three-dimensional optical coupler having light launched into one waveguide, in accordance with an embodiment of the present invention.

Figure 20:
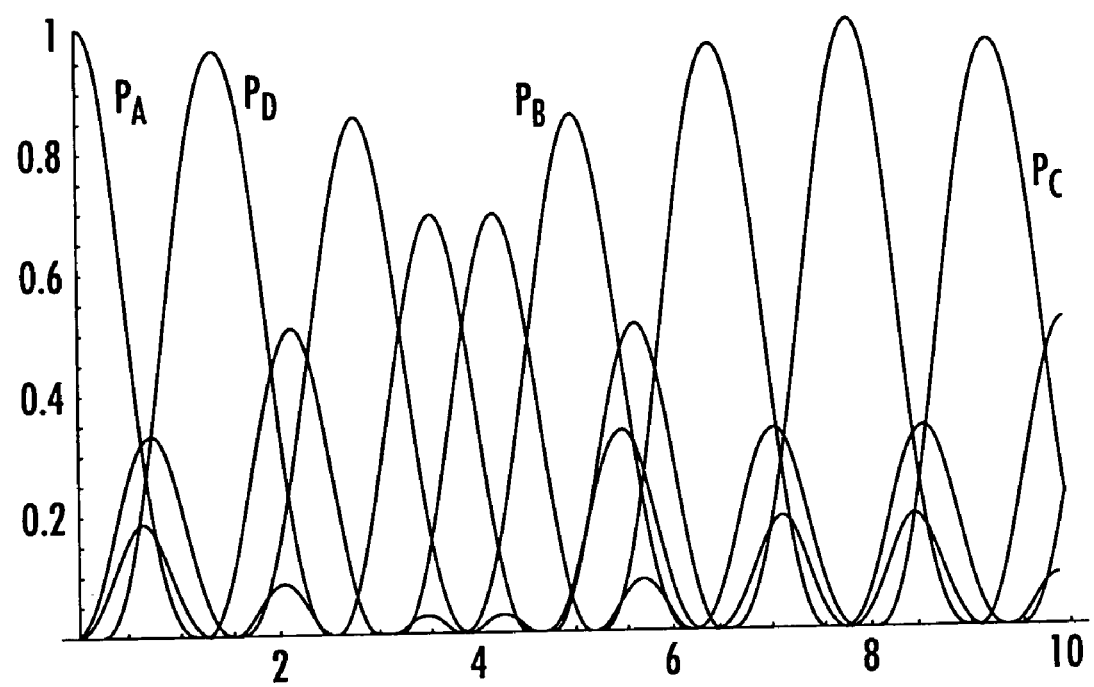

FIG. 20 is a graphical representation of the power transfer amongst the four waveguides in an asymmetric 4×4 three-dimensional optical coupler having light launched into one waveguide, in accordance with an embodiment of the present invention.

Figure 21:
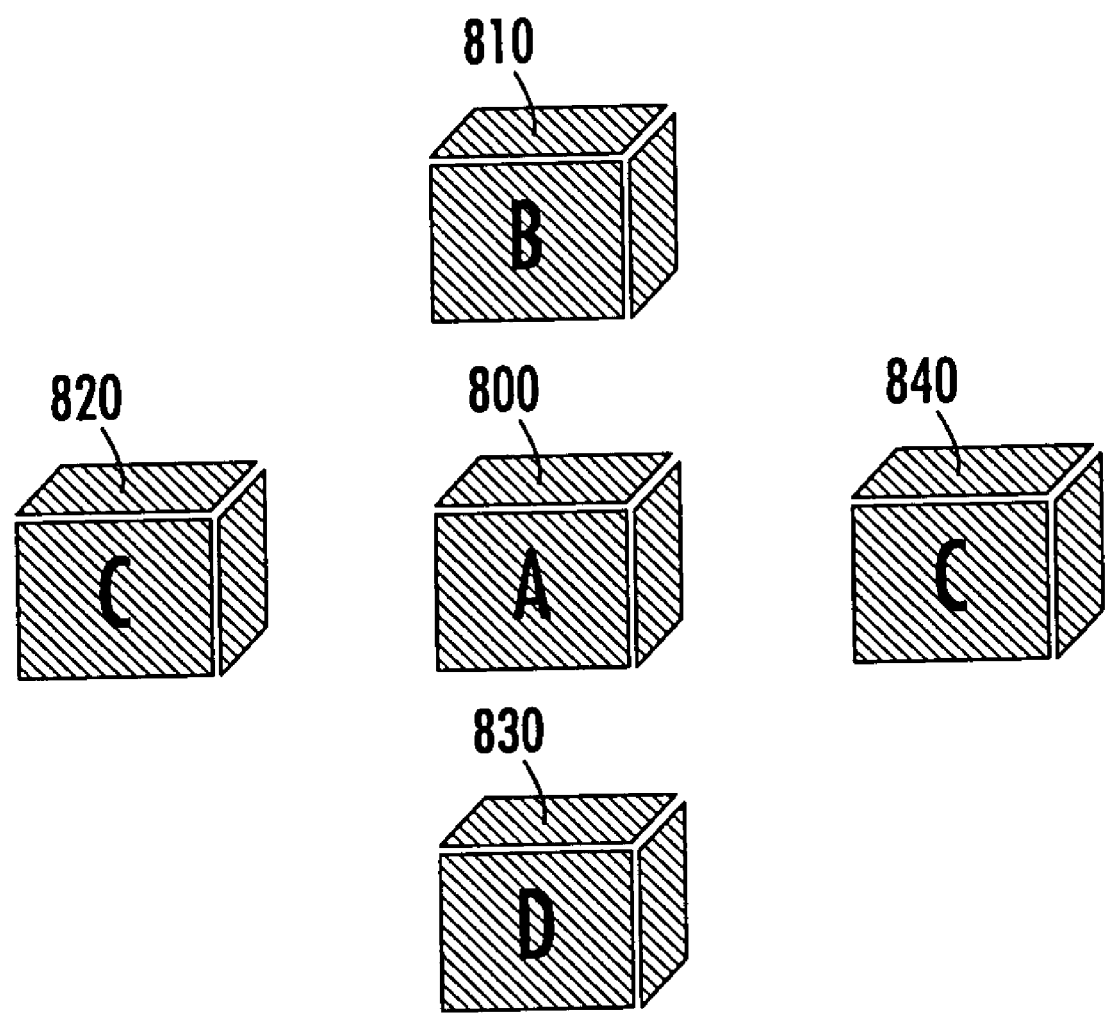

FIG. 21 is a schematic diagram of a star-like three-dimensional optical coupler incorporating sol-gel based waveguides, in accordance with an embodiment of the present invention.

Figure 22:
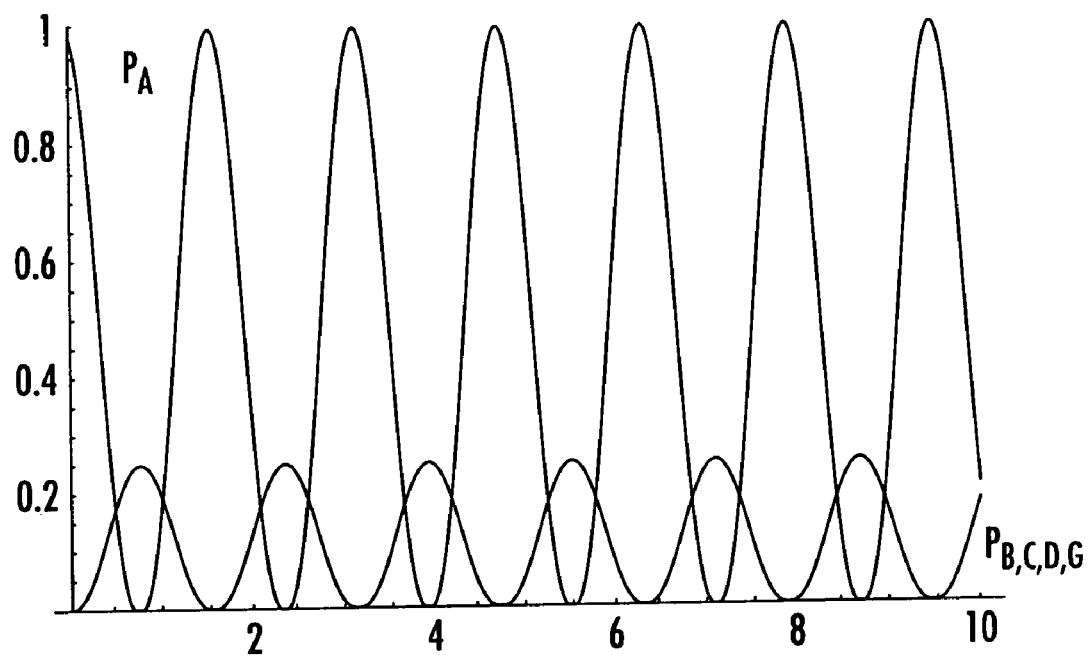

FIG. 22 is a graphical representation of the power transfer amongst the five waveguides in a star-like three-dimensional optical coupler having light launched into the central waveguide, in accordance with an embodiment of the present invention.

Figure 23:
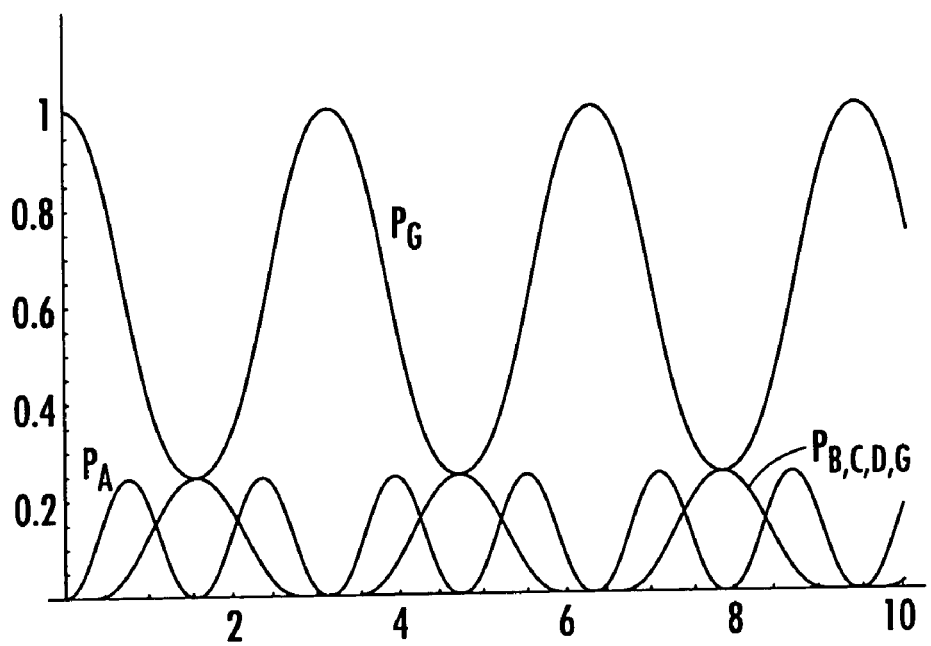

FIG. 23 is a graphical representation of the power transfer amongst the five waveguides in a star-like three-dimensional optical coupler having light launched into one of the surrounding waveguides, in accordance with an embodiment of the present invention.

DETAILED DESCRIPTION OF THE INVENTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

The invention as disclosed includes numerous embodiments of novel optical interconnect (i.e. waveguide) devices and associated optical devices that include these optical interconnects. In addition, the invention incorporates the methods for fabricating the material used to form the interconnects, the fabrication of the interconnects and methods for using the interconnects of the present invention.

Sol-Gel Based Waveguides Formed on Flexible Substrates

In accordance with an embodiment of the present invention, FIG. 1 illustrates a plan view perspective of an optoelectronic device 10 comprising a flexible substrate 20 and one or more optical interconnects (i.e. waveguides) 30 disposed on the flexible substrate. The optical interconnects will be formed of a silica sol-gel based material. The substrate will be formed of a thin pliable material, typically a polymeric material, such as polyimide, or another suitable organic compound film that permits high temperature processing may be implemented. The optical interconnects that are disposed on the substrate may be ridge waveguides, buried waveguides or waveguides formed directly on the surface of the substrate. In addition, FIG. 1 illustrates splitting regions 40 of the optical interconnects which serve to split the optical signals propagating there along.

Sol-gel based interconnects on flexible substrates, such as polymeric substrates, are made possible by incorporating the low temperature fabrication techniques that are detailed in later discussion. These fabrication techniques are in accordance with one embodiment of the present invention. In conventional sol-gel processing, the interconnects are formed within non-flexible substrates, such as glass, and processing temperatures upwards of about 800 degrees Celsius to about 1000 degrees Celsius are typical. The flexible/polymeric substrates of the present invention will not withstand such high temperature processing. In addition, the temperatures used to pre-bake, post-bake and anneal the sol-gel based interconnects need to be low enough (i.e., below the glass transition temperature of the polymer within the sol-gel based material) such that the sol-gel material remains stable and a low loss optical interconnect results.

The optical interconnects 30 shown in FIG. 1 will typically be integrated on the flexible substrate with other optoelectronic components; such as, light sources, amplifiers photodetectors and the like, to provide a two-way optical link for chip-to-chip, board-to-board and system-to system data and signal communication. The corresponding other optoelectronic components may be formed of sol-gel based materials during fabrication processes related to the formation of the interconnects or the components may be formed of distinct materials with processes unrelated to the formation of the interconnects. However, in those embodiments of the invention in which the interconnects and the related components (i.e. light sources, amplifiers and the like) are formed of sol-gel based materials the integrated optoelectronic circuit benefits from cost effective fabrication based on well known microelectronics processing techniques (i.e., UV cure and photolithography). In addition, incorporating both sol-gel based interconnects and sol-gel based optoelectronic components with electro-optical and thermo-optical properties enables the construction of large-scale, multifunctional optoelectronic circuits for the next generation of optoelectronic systems.

Method for Formulating and Synthesizing Sol-Gel for Interconnect Fabrication

In one embodiment of the invention the sol-gel based material used to fabricate the interconnects and other electro-optical components will comprise, a silica sol-gel, a coupling agent, such as zirconium isopropoxide, aluminum isopropoxide or the like, and a monomer, such as methacrylic acid or the like. The silica sol-gel may be incorporated in a sol-gel-based compound, such as Methacryloxyproppyltrimethoxysilane (MAPTMS). MAPTMS is a monomer that combines with an additional monomer, such as methacrylic acid, during formulation to form a polymer. For an example, "Sol-Gel Waveguide Fabrication Parameters: An Experimental Investigation", Du et. al., Journal of Optical Engineering, Vol. 37, pp. 1101–1104, 1998. In formulating and synthesizing the components of this or any other sol-gel based combination the desire is to prevent high temperature plastic flow (HTPF) which prohibits resulting uniform width of the interconnects and to improve the surface hardness of the preheated sol-gel based combination. The ideal combination of the stated constituents or any other combination of sol-gel based materials should exhibit maximum optical clarity with prolonged color stability over time. By maximizing these optical properties it is possible to achieve a low loss optical interconnect.

In order to achieve the desired low optical loss interconnects of the present invention the post-hydrolysis formulation and synthesization of the sol-gel based material will occur in an aqueous-free and alcohol-free environment. By providing for the aqueous-free and alcohol-free environments it is possible to pre-bake, post-bake and anneal the optical interconnects at temperatures below the glass transition temperature of the polymer. For instance, in applications in which MAPTMS is used to form the interconnect, the resulting polymer has a glass transition temperature of about 120 degrees Celsius. By eliminating water and alcohol from the post-hydrolysis processing, pre-bake and post-bake annealing of the MAPTMS based optical interconnect can be accomplished at temperatures of about 110 degrees Celsius. The resulting optical interconnect exhibits long-term color stability because the glass transition temperature of the polymer is not reached during fabrication. As a result of this stability the optical interconnects of the present invention can achieve long-term optical loss of less than about 0.2 dB.

In one embodiment of the present invention the synthesizing process will entail the following steps. The sol-gel based material, such as MAPTMS, is pre-hydrolyzed with an aqueous acid solution, such a hydrochloric acid (HC1) solution (about 0.01 mole solution). The coupling agent and additional monomer, such as zirconium isopropoxide and methacrylic acid, will then be mixed with 1 to 1, 2, 3, and 4 molar ratio. Typically the synthesized sol-gel mixture will be aged for periods between about 12 to 24 hours to facilitate the proper thickness of the sol-gel for interconnect fabrication purposes.

In one specific embodiment of the invention, the pre-hydrolyzed sol-gel based material, such as MAPTMS is mixed with nitric acid, typically 0.001 molar concentrate nitric acid. After introduction of the nitric acid, a photo-initiator is added to the mixture, typically in a ratio of about 2 parts photo-initiator to about 33 parts pre-hydrolyzed MAPTMS solution. The resulting sol-gel base solution is stirred for a prolonged period, typically about 12 to about 24 hours, preferably about 16 hours.

A separate dopant solution will comprise the coupling agent, typically zirconium or aluminum isopropoxide and the additional monomer, typically methacrylic acid mix in a 1:1 ratio. To facilitate reaction this solution will typically be vigorously shaken for upwards of about one minute followed by a period of about fifteen minutes in which the solution is allowed to stand without agitation. The dopant solution is then added slowly to the sol-gel base solution, typically in a ratio of about two parts dopant solution to about 7 parts sol-gel base solution. The combined solution is then aged by stirring the solution for a period of about 12 to about 24 hours, preferably about 16 hours. The resulting doped sol-gel base mixture is consistent with material used to form the core layer of the waveguide. The material used to form the cladding layer will typically be prepared in a similar fashion, with generally less zirconium so as to facilitate a lower refractive index in the cladding layer. Alternately, the resulting sol-gel base mixture described above may be used for the cladding layer and a formulation with more zirconium may be prepared to form the core layer.

Figure 2A:
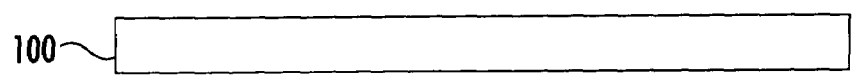

Method for Fabricating Ridge and Buried Sol-Gel Based Waveguides on a Flexible Substrate FIGS. 2A–2F illustrate various cross-sectional views of stages in the fabrication process of ridge and buried sol-gel based waveguides on a flexible substrate, in accordance with an embodiment of the present invention. Initially, as depicted in FIG. 2A, the surface of the substrate 100 is prepared for subsequent layering by undergoing conventional cleaning processing. The cleaning and preparation processing will depend on the material used to form the substrate.

Figure 2B:
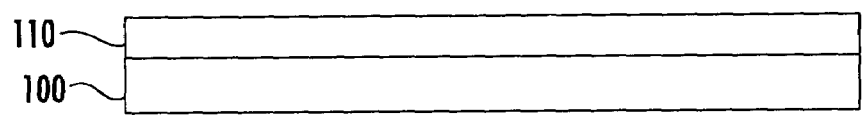

As shown in FIG. 2B, once the substrate has been properly cleaned and prepared a cladding layer 110 is dispersed on the substrate. The cladding layer will generally be required in most waveguide embodiments, however it is possible to form the waveguide without a cladding layer. The cladding layer will typically comprise a sol-gel based mixture, although other materials may be used to form the cladding layer. Prior to disposing the cladding layer on the substrate, it may be necessary to physically filter the cladding layer material to insure uniformity and avoid scattering in the optical interconnects. For instance, in an embodiment using a sol-gel based material to form the cladding layer it may be necessary to filter out all particles greater than about 0.1 micrometers in diameter. The cladding layer may be dispersed on the substrate using one of the known dispersion techniques such as, spin coating, dipping, dispensing, spraying or printing. For example, in the instance in which a sol-gel based mixture is used to form the cladding layer it may be spin coated at a spin rate between about 700 and about 4000 rpm with resulting sol-gel films having a thickness of about 5.5 micrometers to about 1.6 micrometers. In one embodiment of the invention, a minimum cladding layer thickness is about 4.0 micrometers. For example, the minimum thickness can be achieved using about 10 molar percent zirconium or aluminum synthesized MAPTMS sol-gel, aged for about 12 hours, spin coated at a rate of about 2,000 rpm. It should be noted that the thickness of the cladding layer will depend upon the material used to form the substrate. Once the sol-gel mixture is disposed on the substrate it is then subjected to a pre-bake process. The pre-bake temperature and duration will affect the overall quality of the waveguide.

Figure 2C:
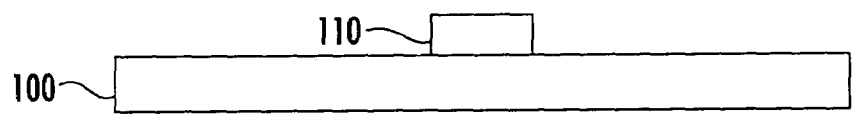

The cladding layer 110 is then masked for subsequent photolithography processing. The masked cladding layer is then subjected to a cure procedure that will cure the exposed regions and allow for unexposed regions to be chemically removed. For example, the cure procedure may involve a deep UV-light cure (e.g. 254 nm, 30W, Spectroline UV-cure device, available from the Spectronics Corporation of Westbury, N.Y.). Unexposed cladding layer regions and the maskant may be washed away using an organic solvent, such as a combination of methanol and acetone. The resulting structure is shown in FIG. 2C with the exposed region of the cladding layer 110 remaining and the unexposed regions of the cladding layer having been removed.

It should be noted that various fabrication parameters will impact the overall quality of the resulting sol-gel based interconnect/waveguide. For example, it has been observed that parameters such as, but not limited to, pre-bake time and temperature, UV-cure time, photolithography solvent ratio and post-bake anneal time and temperature will affect the quality of the resulting waveguide. In this regard, the time and temperature of the pre-bake process affect the shape and definition of the waveguide. As the pre-bake time increases the waveguide becomes narrower in shape and better defined. However, excessive pre-baking results in irregularities in the shape of the waveguide and in some instances cracks in the waveguides are observed. The pre-bake temperature will be maintained below the glass transition temperature of the sol-gel based material to insure long-term color stability of the interconnect. For instance, in embodiments in which the sol-gel based material comprises MAPTMS the glass transition temperature is about 120 degrees Celsius, and thus the pre-bake temperature, as well as, the post anneal temperature should be below 120 degrees Celsius. In one embodiment of the invention an optimal pre-bake temperature is in the range of about 100 to about 110 degrees Celsius for a period in the range of about 20 to about 60 minutes.

The UV cure time affects the subsequent hardness and size of the resulting waveguide. Generally, exposure times less than about two minutes are not enough to sufficiently harden the sol-gel mixture and exposure times in excess of 6 minutes result in an undesirable increase in the size of the waveguide and irregularities in the shape of the waveguide. In one embodiment of the invention an optimal UV cure time is about 2 to about 3 minutes in applications using a deep UV cure (e.g. 254 nm, 30 W, Spectroline). Duration of the cure time will vary depending on the thickness of the cladding layer, the strength of the UV light and the material used to form the cladding layer. In one embodiment of the fabrication process the solvent used as the masking rinse comprises a mixture of methanol and acetone, an optimal ratio of methanol to acetone was observed to be about 3 parts methanol to about 1 part acetone.

Once the unexposed regions of the cladding layer 110 are removed, the cladding layer undergoes a post-bake anneal process to provide additional strength to the resulting interconnect and to lessen the brittleness of the resulting interconnect. A typical post-bake anneal cycle will be about 7 to 10 hours at a temperature of about 115 degrees Celsius. To insure long-term stability and low optical loss in the interconnect the post-bake anneal temperature should be maintained below the glass transition temperature of the material used to form the cladding layer. Thus, for embodiments implementing MAPTMS in the sol-gel based mixture the post-bake anneal temperature will be maintained below the glass transition temperature of 120 degrees Celsius.

Figure 2D:
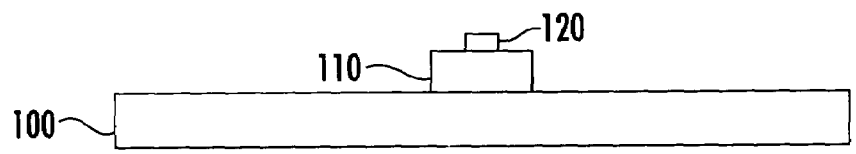

Once the post-bake anneal process is completed, the core region of the waveguide is formed on the unexposed remaining cladding layer 110. This process involves dispersing the core material on the top surface of the cladding layer, masking the core region to define the region, curing the core region and removing exposed regions of the core material. The resulting structure is shown in FIG. 2D with the unexposed portion of the core layer 120 remaining on the cladding layer 110. The FIG. 2D illustration is indicative of a completed ridge waveguide structure. A typical resulting interconnect structure will have a core region of about 3 micrometers to about 5 micrometers in height and a minimum of about 4 micrometers to about 5 micrometers in width.

In one embodiment of the invention the core region comprises an about 20 to about 25 molar ratio zirconium or aluminum sol-gel based material. This would account for an increase in the refractive index of the core region by about 0.01 in comparison to the cladding layer, in the instance in which the cladding layer comprises an about 10 molar ratio zirconium sol-gel based material. The sol-gel based material used for the core region is typically aged for about 12 hours to about 24 hours prior to disposing on the interconnect construct. Prior to disposing the core layer on the interconnect construct, it is, typically, necessary to physically filter the sol-gel based cladding layer material to insure uniformity and avoid scattering in the optical interconnects. For instance, it may be necessary to filter out all particles greater than about 0.1 micrometers in diameter. The core region can be dispensed on the cladding layer using one of the known dispersion techniques such as, spin coating, dipping, dispensing, spraying or printing. For example, in one embodiment of the invention the core layer is spin coated to the cladding layer at a spin rate of about 2,500 rpm. The core layer is then subjected to a pre-bake process. As previously discussed (for embodiments in which the sol-gel based material forms the cladding layer), the time and temperature of the core layer pre-bake process will affect the shape and definition of the waveguide. The pre-bake temperature will be maintained below the glass transition temperature of the sol-gel based material to insure long-term color stability of the interconnect. For instance, in embodiments utilizing MAPTMS the glass transition temperature is about 120 degrees Celsius, and thus the pre-bake temperature, as well as, the post anneal temperature should be below 120 degrees Celsius. In one embodiment the pre-bake cycle will be about 40 minutes at about 110 degrees Celsius.

The preheated sol-gel core layer is then cured, for example, by implementing deep UV-light (e.g. 254 nm, 30 W, Spectroline UV cure device) for a period of about 10 minutes. The duration of the cure cycle will depend upon the strength of the UV light, the material used to form the core region and the thickness of the core layer; thicker waveguides will require longer UV exposure time to insure complete surface bonding between the layers. The unexposed regions of the core layer are typically removed by chemical treatment. By way of example, one embodiment of the invention uses a methanol-acetone solvent mixture of about 3 parts acetone to about 1 part methanol.

Once the unexposed regions of the core layer 120 are removed, the core layer undergoes a post-bake anneal process to provide additional strength to the resulting interconnect and to lessen the brittleness of the resulting interconnect. A typical post-bake anneal cycle will be about 5 to about 10 hours at a temperature of about 115 degrees Celsius. To insure long-term stability and low optical loss in the interconnect the post-bake anneal temperature should be maintained below the glass transition temperature of the sol-gel based material used to form the core layer. Thus, for embodiments implementing MAPTMS in the sol-gel based mixture the post-bake anneal temperature will be maintained below the glass transition temperature of 120 degrees Celsius.

Figure 2E:
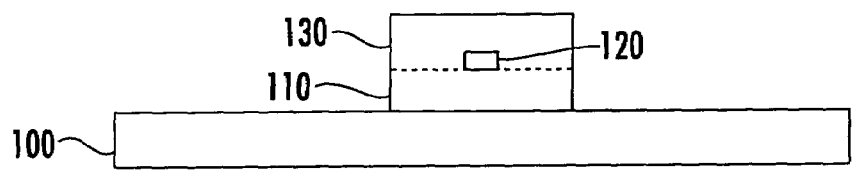
Figure 2F:
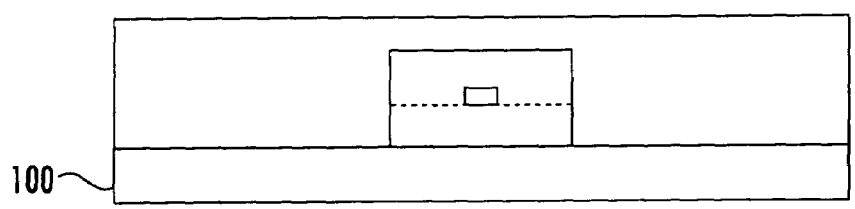

FIGS. 2E and 2F, illustrate optional embodiments of the invention in which the core layer 120 has been buried with an additional cladding layer 130 (FIG. 2E) and, in the FIG. 2F embodiment, the waveguide has been further protected by placing a polymer layer on the resulting waveguide and substrate. The FIG. 2E illustration is indicative of a completed buried waveguide/interconnect structure. The additional cladding layer 130 will typically be disposed on the surface of the underlying cladding layer 110 and core layer 120 using generally similar deposition techniques to those which were implemented to dispose the initial cladding layer. The additional cladding layer will typically comprise the same material used to form the initial cladding layer 110. In one embodiment of the invention, the additional cladding layer will comprise a sol-gel based material, such as a MAPTMS based material or the like. In most instances the additional cladding layer will be applied using the same parameters (spin rate, preheat time and temperature, UV cure time, chemical etch and post-bake anneal cycle, etc.) to insure uniform thickness between the initial cladding layer and the additional cladding layer and uniform performance characteristics.

FIG. 2F illustrates a buried waveguide in which the substrate 100 and the cladding layers 110 and 130 are further protected by a polymer layer 140. The polymer layer may comprise any suitable polymer material and the thickness of the layer will depend upon the application and/or environment for which the interconnect will be utilized in. The polymer layer serves to add further protection for the waveguide and may serve as the foundation surface for subsequent structures that may be built on or above the interconnect. The polymer layer will typically be disposed on the surface of the underlying cladding layers and the substrate using conventional deposition techniques, such as spin coating, dipping, dispensing, spraying or printing.

Method for Fabricating Surface Sol-Gel Based Waveguides on a Flexible Substrate

In addition to the ridge and buried waveguides shown in FIGS. 2A–2F, surface sol-gel based waveguides are also possible and within the inventive concepts herein disclosed. Surface waveguides are of particular importance in backplane applications. FIGS. 3A–3D illustrate various cross-sectional views of stages in the fabrication process of surface sol-gel based waveguides on a flexible substrate, in accordance with an embodiment of the present invention.

Figure 3A:
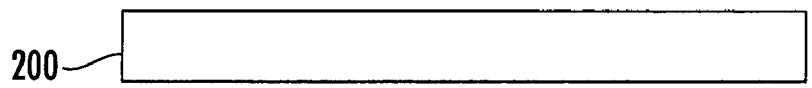
Figure 3B:
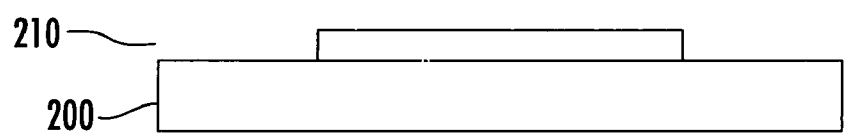
Figure 3C:
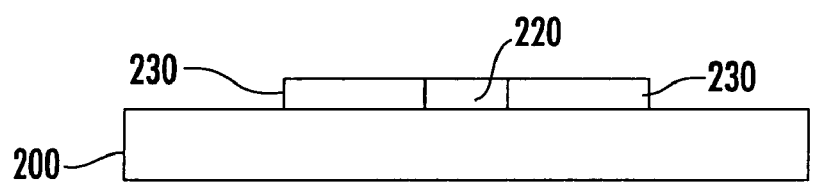
Figure 3D:
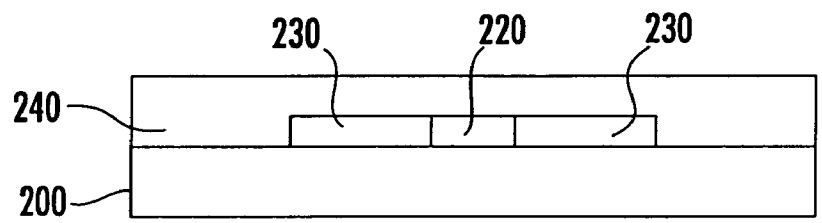

Initially, as shown in FIG. 3A, the surface of the substrate 200 undergoes a conventional cleaning process to properly prepare the substrate for subsequent processing. As shown in FIG. 3B, once the substrate has been prepared a sol-gel based material layer 210 is disposed on the substrate. The sol-gel based mixture may be dispersed on the substrate using one of the known dispersion techniques such as, spin coating, dipping, dispensing, spraying or printing. For example, the sol-gel based mixture may be spin coated at a spin rate between about 700 and about 4000 rpm with resulting sol-gel films having a thickness of about 5.5 micrometers to about 1.6 micrometers. The typical minimum thickness of the sol-gel based material layer will be about 3 micrometers. In one embodiment of the invention, the minimum thickness can be achieved using about 10 molar percent zirconium or aluminum synthesized MAPTMS sol-gel, aged for about 12 hours, spin coated at a rate of about 2,000 rpm. In alternate embodiment, the molar percent of zirconium or aluminum may vary between about 10 percent to about 30 percent.

Once the sol-gel mixture is disposed on the substrate or surface of interest it is then subjected to a pre-bake process. The pre-bake temperature and duration will affect the overall quality of the waveguide. The pre-bake temperature will be maintained below the glass transition temperature of the sol-gel based material to insure long-term color stability of the interconnect. For instance, in embodiments utilizing MAPTMS the glass transition temperature is about 120 degrees Celsius, and thus the pre-bake temperature, as well as, the post anneal temperature should be below 120 degrees Celsius. In one embodiment the pre-bake cycle will be about 40 minutes at about 110 degrees Celsius.

After completion of the pre-bake process, the sol-gel based material layer 210 is then masked for subsequent photolithography processing. The mask is then subjected to a cure procedure that will cure the exposed regions to have a higher refractive index than the unexposed regions. Hence, a waveguide is formed as a result of this UV exposure process. For example, the cure procedure may involve a deep UV-light cure (e.g. 254 nm, 30 W, Spectroline UV cure device).

The resulting structure is shown in FIG. 2C after removal of the mask. The exposed region 220 has a higher refractive index than the unexposed or masked region 230. In an alternate embodiment as depicted in FIG. 2D, the surface waveguide may be buried by coating the surface waveguide with a burying layer 240. The burying layer may comprise the same sol-gel based material as the underlying sol-gel based material layer or the burying layer may comprise other materials. In most instances the burying layer will be applied using similar parameters (spin rate, preheat time and temperature, UV cure time, chemical etch and post-bake anneal cycle, etc.) to those that were used to form the sol-gel based material layer. The thickness of the burying layer will typically be dictated by the application and environment of the resulting surface interconnect.

Sol-Gel Based Waveguides Incorporating Prisms, Gratings and Active Devices

An additional embodiment of the present invention incorporates the implementation of micro devices, such as prisms, gratings and the like, to provide for coupling and decoupling. In addition, micro devices such as grating, prisms etc. can be fabricated to allow coupling and de-coupling of light into and out of the waveguides. The use of such micro-devices would typically be in conjunction with the ridge and surface waveguides discussed above. FIG. 4A and 4B illustrate lengthwise cross-sectional views of waveguides 300 having prism coupling 310 and grating coupling 320. The microdevices are typically fabricated on the waveguide construct using conventional microelectromechanical processing techniques.

In accordance with the typical optical interconnect of the present invention described above, prism coupling structures and grating coupling structures will be formed within layers below, above or adjacent to the optical interconnects. For example, a layer of material may be disposed above the optical interconnect structure; above the core layer, the cladding layer and/or the polymer layer. Any material suitable for microelectromechanical processing may be used, including but not limited to, a sol-gel based material or the like. By fabricating the microdevices from the same or similar material used to form the interconnect the overall device benefits from fabrication efficiencies and unitary performance characteristics. The material used to form the microdevices will be deposited using convention deposition techniques such as, spin coating, dipping, dispensing, spraying or printing. Standard photolithography techniques are typically used to define the structure of the microdevice within the layer. The grating and/or prism coupling devices that are formed may be constructed in such a fashion that they are wavelength sensitive or they may be constructed with other optical features.

FIG. 5 illustrates a perspective view of a simplified optical backplane implementing grating microdevices in conjunction with sol-gel based waveguides, in accordance with an embodiment of the present invention. A substrate 330 has one or more optical interconnects or waveguides 300 formed thereon. Coupling and de-coupling gratings 340 and 350 are fabricated for coupling light entering and de-coupling light exiting the waveguides. The coupling gratings 340 are in optical communication with light sources 360, such as lasers and serve to couple the light emitted from the lasers into the waveguides. The de-coupling gratings 350 are in optical communication with detectors 370 and serve to de-couple the light as it exits as the waveguides. In a typical backplane application electrical signals coming from electronic circuitry (not shown in FIG. 5.) will be converted to optical signals via the lasers, such as vertical cavity lasers, and then transmitted through the waveguide to the detectors. As shown in FIG. 5, the interconnects 300 and coupling and decoupling gratings 340 and 350 may be formed on the substrate 330 while the light sources 360 and detectors 370 may reside external to the substrate in a separate substrate or platform. In this instance, the lasers and detectors are typically constructed using a different technology and are brought into optical communication with the interconnects by a bonding process or the like.

In one embodiment of the invention, the light sources 360 and the detectors 370 are fabricated from sol-gel based materials. In this regard, these active devices can be formed directly on the same substrate or in the same polymer film as the waveguides using the same lithography techniques and, thus the same materials, as the underlying waveguides and microdevices. Such an integration of the active devices with the waveguides provides for a comprehensive optical system capable of point-to-point, chip-to-chip, and circuit board-to-circuit board communications. The integrated optical system of the present invention benefits from not requiring external light sources and detectors and, thus, problems associated with optical alignment are eliminated.

FIG. 6 illustrates a perspective view of such an embodiment of the invention in which the light sources 360 and the detectors 370 are integrated in a single substrate construct that additionally embodies the interconnects and the coupling devices. A substrate 330 has one or more optical interconnects or waveguides 300 formed thereon. At opposite lengthwise ends of the waveguide are light sources 360, such as lasers, and detectors 370. The light sources are in direct optical communication with pumped light source 380. The pumped light source may comprise an optically pumped light source or an electrically pumped light source. Any combination of light sources 360, detectors 360 and pumped laser 380 may be fabricated from sol-gel based materials. In this regard, these active devices can be formed directly on the substrate or in the polymer film using the same lithography techniques and, thus the same materials, as the underlying waveguides and microdevices. The material used to form the lasers and detectors will be deposited using convention deposition techniques such as, spin coating, dipping, dispensing, spraying or printing. Standard photolithography techniques are typically used to define the structure of the lasers and detectors within the layer.

Sol-Gel Based Waveguides Incorporating Amplifiers and Side Pumping

FIG. 7A depicts a plan view of sol-gel based waveguides 400 in a substrate 410 having multiple splitting region 420 and incorporating the use of multiple amplifiers 430, in accordance with an alternate embodiment of the present invention. In large substrates and in instances where many splitters are implemented the likelihood of signal loss may become a factor. In those applications, integrated optical amplifiers can be fabricated by selectively doping the desired amplified regions of the waveguide. For example, the waveguide may be doped with rare earth ions, such as ions of erbium, ytterbium, neodymium, or a combination thereof. The rare earth ions used as dopants will characteristically have transition lines in the about 0.2 micron to about 3 micron spectrum, preferably in the about 1.5 micron spectrum, when illuminated by optical pumping means having a generally suitable wavelength (i.e., the optical pumping means must have a wavelength that is absorbed by the dopant and causes the pumping means to move to an excited state). The doping process can be accomplished during the fabrication by adding the dopant to the sol-gel based material prior to fabrication or the dopant can be added in a post processing technique, such as laser deposition or ion implantation.

In one embodiment of the invention erbium (III) tris (8-hydroxyquinoline) (ErQ) is added to the sol-gel based mixture during formulation with the end result being an erbium doped sol-gel based interconnect or related optical device. Unlike conventional erbium doped sol-gel that requires annealing at high temperature (about 600 to about 1110 degrees Celsius), the ErQ dopant and associated doping process provide for an erbium doped sol-gel based material that is photo-sensitive and can be annealed at low temperature (less than about 120 degrees Celsius).

To facilitate the amplification of the optical signal, pumping can be done generally from the side with respect to the substrate in order to excite the rare earth ions and amplify the optical signals. In order to efficiently side pump the interconnects of the present invention either cylindrical lenses or diffractive lenses specially designed for a side pump application will be implemented. For instance, external VCSELs may be used to side pump the doped waveguide or surface emitting light sources that may be fabricated in an integrated system may be implemented. In the integrated system embodiment the light sources will typically be disposed under or above the amplified doped region of the waveguide. In the applications that implement such surface emitting light sources proper waveguide and light source packaging (i.e. bonding or the like) will insure that no further alignment of the light source and the waveguide is required. Light amplification, resulting from side pumping the doped amplifier regions, eliminates problems associated with signal loss and enables the implementation of sol-gel based waveguides, especially those fabricated on flexible substrates in highly complex optical circuits and across relatively long interconnect distances.

FIG. 7B illustrates a plan view diagram of a multi-layer optical circuit having sol-gel based waveguides and inter-layer coupling, in accordance with yet another embodiment of the invention. In this illustration three layers, 410a, 410b, and 410c of waveguides 400 exist either on individual substrates or all in one substrate. To fabricate 3-D waveguide structures on one substrate the first layer of waveguide structures and/or optical devices are formed within a first plane of orientation (generally horizontal to the underlying substrate). The first layer of waveguide structures and/or optical devices will then serve as the "substrate" for a subsequently formed second layer of waveguide structures and/or. optical devices that will exist in a second plane of orientation. In a similar fashion, additional layers of waveguide structures and/or optical devices may exist in other planes of orientation. The waveguide and/or optical device layers may be separated by a dividing layer that creates an additional plane of orientation in the overall scheme of 3-D waveguide structure. The inter-layer coupling 440, illustrated but not limited to the circled regions is implemented by three-dimensional optical couplers. The discussion on three-dimensional optical couplers, which embody an alternate embodiment of this invention, is forthcoming in this detailed description. In addition, other optical components, such as switches, wavelength selective filters or the like can be incorporated into the multi-layered optical circuit to create a multi-layered optical systems in which some or all of the devices and components comprising the system are fabricated from sol-gel based materials.

Optical Sensors Embodying Sol-Gel Based Waveguides

In yet another embodiment of the invention, optical sensors can be fabricated that embody both single mode oscillation and multimode oscillation sol-gel based waveguides. In some optical circuits, there are regions (or spots) of high stress or high temperature. Integration of optical sensors in the optical circuits allows these physical parameters to be measured. These sensors can be constructed as integrated interferometers or as formation of gratings in or proximate to the sol-gel based waveguides.

Optical sensors that incorporate sol-gel based waveguides have widespread applicability in many applications, including but not limited to, the medical industry. For example, such sensors can be implanted in a patient or used as a disposable diagnostic tool. Additionally, optical sensors of this nature can also be used for "smart structures". In this regard, by configuring the optical sensors so that the interconnect and substrate are flexible they become ideal for smart structural sensing. An application of these sensors is in the area of "smart skin". Smart skin sensors can monitor the internal conditions of the structure during fabrication and operation. For example, such sensors have various implications in the automotive, aerospace and space industries. Characteristically, optical sensors that incorporate sol-gel based waveguides have a signal loss in the range of less than about 2 dB/cm. As signal loss approaches zero in the waveguides, the accuracy of the optical sensor increases. By incorporating previously discussed amplification means and side pumping techniques it is possible to fabricate an optical sensing unit having optical loss that approaches zero.

For example, interferometric sensors embodying sol-gel based waveguides can be made for temperature, pressure and strain sensing. FIG. 8 illustrates a schematic representation of a Michelson interferometer configuration that includes single mode waveguides. As described above, it is possible to fabricate light sources and detectors in much the same fashion as the interferometer herein described. As such the active devices and the interferometer can be integrated and, thus, the resulting optical system only requires external electrical power. It is also possible to fabricate more than one interferometer on any given substrate. In such an array formation the interferometers are capable of multiple sensing. An array of interferometers may be implemented in an accelerometer, a vibration sensor, and for analysis of biological and chemical species. An alternate interferometer, such as a Mach-Zehnder interferometer shown in FIG. 13, can be fabricated by implementing a second splitter that follows the first splitter.

Additionally, it is also possible to incorporate gratings into the waveguides that are wavelength selective and thereby create an optical sensor that has physical sensing capabilities.

Tunable Laser Arrays Incorporating Sol-Gel Based Waveguides

In accordance with an embodiment of the present invention, a tunable laser array incorporating sol-gel based waveguides can be fabricated. FIG. 9 depicts a schematic drawing of a substrate, typically, but not limited to, a flexible substrate 500, having four parallel sol-gel based waveguides 510 formed thereon. The quantity of waveguides in the tunable laser array is shown in FIG. 9 by way of example, other embodiments of the invention will comprise different quantities of waveguides. The sol-gel waveguides in this embodiment will typically exhibit electro-optic properties, typically by including one or more electro-optic materials in the formulation of the material used to fabricate the waveguides. The nature of these waveguides will dictate that the electro-optic properties will change when the waveguides are subjected to an electrical stimulus. The waveguides have corresponding gratings 520 and electrode plates 530 proximate to the individual waveguides. The gratings may be incorporated into the waveguides to achieve single frequency operation of the lasers. The electrode plates are positioned on or in close proximity to the substrate and along either side of the guiding region to effectively change the refractive index of that region. By changing the refractive index of the guiding region of the waveguides by altering the voltage applied across the electrode plates, rapid wavelength tunability of the laser array will be realized.

Typically, the core region of these waveguides will be doped with rare earth ions, such as ions of erbium, ytterbium, neodymium or the like, to create an active region within the waveguide. When the active region of the waveguide is optically pumped, laser action will occur. The doping process can be accomplished during the fabrication by adding the dopant to the sol-gel based material prior to fabrication (as previously discussed) or the dopant can be added in a post processing technique, such as laser deposition or ion implantation. When sol-gel based waveguides are doped with rare earth dopants, such as erbium, ytterbium, neodymium and the like the basic building block exists for amplifiers and lasers to be incorporated into the structure of the device. In this regard, sol-gel processing allows dopant levels more than 40 times higher than waveguides made by chemical vapor deposition. By drastically increasing the dopant levels the resulting waveguides have superior absorption and emission capabilities. Additionally, by co-doping the waveguide with a combination of rare earth ions, such as ions of ytterbium with erbium, stronger absorption of pump laser light will generally result and a transfer of energy into erbium ions occurs.

FIG. 10 illustrates a schematic drawing of the pumping process related to the laser waveguides depicted in FIG. 9. In this configuration side pumping is employed via an array of VCSELs 540, typically a low cost, mass producible 980 nanometer VCSEL array fabricated on a companion substrate. The companion chip is then brought in to close physical contact and alignment with the waveguides so that the VCSEL array can effectively side-pump the active regions of the waveguides and, thus, produce optical gain. The proximity of the companion chip to the waveguide construct will be dictated by various design criteria and the application environment of the interconnects. Although the configuration shown in FIG. 10 illustrates a side-pumping technique, the laser arrays shown and described are equally applicable to conventional end-pumping processes. Wavelength tunability is provided for via the electrode plates 530 disposed along the guiding region 520 of the waveguides 510. FIG. 11 illustrates a schematic of a tunable laser array in which the companion substrate 550 housing the VCSEL array 540 is brought into a close physical relationship with the sol-based waveguides so as to render an integrated optical system having multiple tunable lasers.

FIG. 12 schematically illustrates a Distributed Bragg Reflector (DBR) array of two lasers comprised of sol-gel based waveguides 510 having gratings 560 on both ends of the waveguides that serve to act as mirrors. The output of the laser can further be amplified by having the doped (or active) waveguide region extend beyond the limit of the output reflector grating, forming the "amplifier" region. The amplifier region can in turn be side-pumped by another array of VCSELs or simply the continuation of the same array of VCSEL used to pump the lasing region. In order to generate the desired power the waveguide length may be extended beyond the DBR so as to amplify light as it communicated from the laser. Thus, the additional extended segment of the waveguides can be optically pumped to act as a light amplifier. The refractive index of each waveguide can be controlled dynamically by applying external voltage. Therefore, each laser in the array can generate the desired wavelength independent of one another. In application, a laser array followed by an amplifier array in one substrate enables arbitrary wavelengths with desired optical powers.

The emission wavelength of the lasing region is a function of the total optical cavity length of the lasing region. The optical cavity length in turn is a function of the product of the physical cavity length and the refractive index of cavity. In certain designs, tunability in lasers is achieved through altering the physical cavity length by deploying moving output mirror parts, such as a Coretek's MEMS based tunable laser. This is typically not desirable and the laser performance is compromised with respect to line jitter and noise. Alternatively, the refractive index can be altered, keeping the physical length constant, to tune the cavity optical length. This is easily achieved through the use of material with electro-optical properties in the cavity, such as certain organic material, such in response to an applied voltage across the electrodes deposited around the cavity, the refractive index is changed causing a change in the emission frequency of the laser. Through the linear combination of such tunable laser structures and pursuant amplifier regions, optical emissions of wavelengths in the telecom band with varying power levels, as determined by the level of amplification applied, can be achieved.

In a further embodiment of the present invention, the interconnects/waveguides of the present invention may be incorporated in optical modulators by introducing organic components, such as electro-optic polymer materials. It is possible to physically mix silica sol-gel with an organic component, or via a silicon-carbide it is possible to chemically link silica sol-gel and organic components. In this regard, the properties of the sol-gel material can be varied by adding an organic component. For example, by mixing silica sol-gel with a polymer having electro-optic properties silica sol-gel waveguides can be produced with high non-linearity, thus, providing the capability to modulate light intensity. This nonlinear waveguide has a very low dielectric constant and very low microwave dispersion, so at high-speed operation it would be easy to obtain phase matching required for the optical modulation. As is known by those of ordinary skill in the art, the optical waveguides will require polling (i.e., application of a strong electric field to produce a dipole effect in the material) in order for the waveguides to used as optical modulators.

In accordance with yet another embodiment of the invention, the same electro-optically active interconnect described above can be used to create tunable wavelength filters. In this application the tuning is accomplished with externally applied voltage similar to the electro-optic modulator. In one embodiment, a tunable wavelength filter in accordance with the present invention will comprise an electro-optic interconnect/waveguides that has Bragg gratings formed thereon. By implementing such tunable wavelength filters in waveguide lasers the resulting laser would be, characteristically, frequency agile.

Add/Drop and Dispersion Compensation Filters Incorporating Sol-Gel Based Waveguides FIG. 13 illustrates a schematic of a drop/add filter embodying sol-gel based waveguides in accordance with an embodiment of the present invention. In this embodiment a Wavelength Division Multiplexing (WDM) system incorporates sol-gel waveguides and Bragg gratings in a Mach-Zehnder interferometer configuration. Two sol-gel based waveguides 600 are formed in Mach-Zehnder interferometer configuration. Each waveguide having identical Bragg gratings 610 formed within a corresponding waveguide arm. In application, the drop/add filter will typically have a stream of wavelengths entering input port 1. For example, port 1 may have eight wavelengths ($\lambda_1, \lambda_2 \ldots \lambda_8$) entering the filter. Assuming the Bragg grating's reflection wavelength is $\lambda_2$, light of $\lambda_2$ together with other wavelengths will be split equally between the two arms of the coupler; however $\lambda_2$, will be reflected by the two identical gratings. On reaching the first coupling region 620, a coherent recombination will occur and $\lambda_2$ will exit through port 2. The remaining wavelengths will continue to propagate, recombine at second coupling region 630, and exit through port 3. Because of the symmetry of the device, wavelength $\lambda_2$ can be added at port 4 to exit with other wavelengths at port 3. Thus, this drop/add filter incorporating sol-gel based waveguides is capable of redirecting one wavelength of a multiple wavelength signal.

FIG. 14 illustrates a schematic view of an add/drop filter using an optical circulator 650 incorporating sol-gel based waveguides. The waveguide is typically a single mode waveguide having a grating 660 formed on the waveguide at port 2. The grating provides for all input wavelengths ($\lambda_1$, $\lambda_2 \ldots \lambda_n$), except the selected wavelength, to be output through port 2. In the example shown the selected wavelength is $\lambda_2$. The $\lambda_2$ wavelength is filtered at the grating and is output through port 3. While FIG. 14 illustrates a single waveguide, it is also possible to configure optical circulators having multiple waveguides with variance in the grating structures.

Additionally, the optical sensors previously discussed may be incorporated in integrated filter and WDM systems for the measurement of environmental parameters such as strain, pressure and temperature. For example, it may be advantageous to incorporate a temperature sensor in a WDM system to correct filter drift.

In yet embodiment of the present invention, sol-gel based waveguides having gratings formed thereon, may be incorporated into a chromatic dispersion compensation device. In this regard, the grating structures serve as a selective delay line, which delays signals having the wavelength that travels fastest through the fiber until signals having the other wavelengths catch up. To provide for this phenomenon the spacing of the gratings is chirped, increasing along its length, so that the grating reflects different wavelengths at different points along the fiber. Such a grating could be used in the receiver or transmitter, but is typically incorporated at the receiver. Additionally, the chirped gratings incorporated in the sol-gel based waveguides may be tunable, allowing the transmitter to intelligently introduce appropriate compensation depending on the distance to the receiver or the receiver can tune a single filter to receive signals from multiple sources.

Three Dimensional Waveguide Structures Incorporating Sol-Gel Based Waveguides

As previously discussed the process for fabricating the sol-gel base waveguides of the present invention involves fabricating structure on the substrate rather than etching into the substrate. Therefore, it is possible to incorporate further processing complexity and add more structure over the previously proposed fabrication. In this regard, it is possible, and within the inventive concepts herein disclosed, to fabricate a sol-gel based waveguide on a substrate using the processing methods previously disclosed and then fabricate an additional (or more than one) layer of waveguide or other optical device on top of the base waveguide structure to produce a multilayer, three dimensional, waveguide system. Three dimensional waveguide structures have applicability in power splitters, couplers and the like. An alternate embodiment of the present invention details a three-dimensional, nxm matrix of sol-gel based waveguides that serve as power splitters, couplers or the like.

In a conventional waveguide coupling structure, two waveguides are fabricated in close proximity to one another in order to mutually couple light. As is illustrated in FIG. 8, in the conventional waveguide structure the adjacent waveguides lie in a single plane.

The 3-D optocouplers enable concurrent coupling in the horizontal plane and vertical plane. For horizontal and vertical plane coupling to occur, the waveguides have to be bought in close proximity to one another in both the x and y plane directions.

Figure 15A:
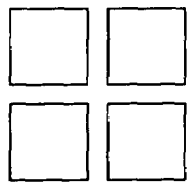
Figure 15B:
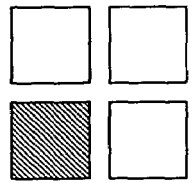
Figure 15C:
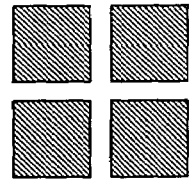
Figure 15D:
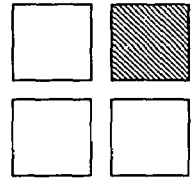

In accordance with an embodiment of the present invention, FIGS. 15A–15D are cross-sectional views of a three dimensional optical coupler incorporating sol-gel based waveguides in 2×2 matrix. FIG. 15A illustrates the cross section when light is not impinged into the optical structure. When light is launched into the input of the lower left waveguide the resulting output of this device may appear as shown in FIGS. 15B–15D with the gray level proportional to the percentage of light in the respective waveguide, i.e., darker means increased percentage of light. The light may remain solely in the waveguide in which the light was launched, (FIG. 15B), the light may be equally divided between all four ports (FIG. 15C) or the light can be totally coupled into the upper right corner waveguide (FIG. 15D). It is also possible to provide for partial coupling (i.e., less than 100% coupling) into other combinations of the four ports. Coupling in the three dimensional waveguide system is accomplished by the wavelength sensitivity of the waveguides. For example, if two distinct wavelengths enter the lower left corner waveguide/port, coupling will result in one wavelength emerging from the same lower left corner port while the other would emerge from the upper right corner waveguide.

Since the typical length of the sol-gel based waveguide devices is relatively short (i.e. about a few millimeters), a successive (m×n) matrix can provide WDM devices with almost no limitation. This out-of-plane coupling provides a volume that incorporates many waveguides in which some couple together in desirable locations and with a desirable coupling length (coupling length is a parameter that determines the wavelength selectivity.)

Three dimensional waveguide couplers may be incorporated into active optical components, such as an optical switch, in accordance with an embodiment of the present invention. The optical switch comprises sol-gel based waveguide couplers that use photo-conductive or photo-refractive material in the coupling region. This material will characteristically be optically transparent. In application, when a second light of different wavelength that is absorbed by the photo-refractive/conductive material is input into the coupler the coupling or boundary conditions that define the coupling (i.e., the refractive index and other similar optical paramters) will be altered and therefore light will not couple to the neighboring waveguide.

FIG. 16 illustrates a schematic drawing of the switching action exhibited in a three dimensional optical switch, in accordance with the present invention. Wavelength $\lambda_1$ is coupled from waveguide 700 into waveguide 710. After a second light of wavelength $\lambda_2$ impinges upon the coupling region 720 the coupling will no longer occur. Therefore, the second light controls the guided wave and switching this light automatically switches the guided beam. Although this switching action is illustrated in a two-dimensional perspective it will prevail in a three dimensional perspective in this embodiment. In the three-dimensional structures it is feasible to fabricate numerous switches with the switching light being directed to the coupling region via a delivery waveguide. This provides the impetus for optical logic, whereby; it is possible to switch between two states, for example 0 and 1.

In accordance with yet another embodiment of the invention, three dimensional waveguide structures can be implemented in a dynamic optical router in which wavelength can be used to select a particular route through a three-dimensional cross-connect switch. This transponder function, being able to dynamically switch from one wavelength to another, can be realized by implementing the previous described wavelength agile tunable lasers in conjunction with the three-dimensional waveguide structures. The versatility that such a dynamic optical router offers will enable many different service protocols (IP, ATM, etc.) to coexist in complex Wide Area Networks (WANs).

Calculations for Sol-Gel Based Waveguide Parameters

The three dimensional waveguide structures disclosed herein will be highly beneficial in integrated optics and telecommunications, in that they can be implemented in multichannel optical couplers, switches, WDM devices, etc.

The basic building block of such structures is a single-mode buried rectangular waveguide. To theoretically analyze the three dimensional waveguide structure it is necessary to start by appreciating the fundamental equations related to the single mode rectangular waveguide. Rectangular dielectric waveguides are the ones most widely used in integrated optics technology. This is due to their simplicity, precision of construction and mechanical stability. Also, single-mode operation can be achieved with relatively large transverse dimensions of the guide compared with the free-space wavelengths, thus relaxing tolerance requirements.

In the case of rectangular waveguides, as well as other structures symmetric with respect to propagation in the z-axis, the permitivity of the structure is invariant along the z-axis. The assumption is made that the free-space permeability is $\mu_0$, in which case the waveguide geometry is completely determined by specifying the dielectric permitivity $\in$ as a function of x and y.

Regardless of how complex the shape of waveguide is (i.e. the complexity of the function $\in(x, y)$), several very general results can be stated concerning the nature and behavior of the guided modes in such structures. These results are essential for the coupled-mode theory, which is of a paramount importance in telecommunications and integrated optics technology. This theory is the basis for designing such important devices as directional and contra-directional couplers, fiber optic connectors, all-optical switches, multiplexers and various other devices. In the three-dimensional model directional couplers are the paramount devices of interest and, thus, the coupled-mode theory will be given due attention.

Equations for the fields in a 2×2 directional coupler have the form:

$$\frac{da_A}{dz} = -jCe^{j(\Delta_{AB}k)z}a_B(z)$$

$$\frac{da_B}{dz} = -jCe^{j(\Delta_{AB}k)z}a_A(z)$$

where $a_i$ is the field amplitude at port i, C is the coupling coefficient, and $\Delta_{AB}k$ is the difference between the propagation constants of channels A and B.

Full power transfer between the waveguides is possible only if the "phase-matching" condition is satisfied:

$$\Delta_{AB}k=0$$

with this condition met, the equations for the 2×2 directional coupler can be expressed as:

$$\frac{da_A}{dz} = -jCa_B(z)$$

$$\frac{da_B}{dz} = -jCa_A(z)$$

the solution of these equations may be expressed as:

$$|a_A(z)|^2 \equiv P_A(z) = P_0 \sin^2(Cz)$$

$$|a_B(z)|^2 \equiv P_B(z) = P_0 \cos^2(Cz)$$

Complete power transfer length is determined by the phase (CZ):

$$CL = \frac{\pi}{2} \Rightarrow L = \frac{\pi}{2C}$$

Thus it is possible for the incident power to be transferred to the second waveguide or to be returned into the first one.

The following discussion teaches the calculations that must be undertaken to assess the parameters for three-dimensional waveguide.

Characteristically, sol-gel materials can be prepared so that the material's refractive index can be tailored to meet the requirements of the application for which the resulting interconnect will be used. In this regard, the refractive index can be varied around the value n=1.5. More specifically, for a waveguide of square cross-section with the side a and the core and cladding refractive indices of:

$$n_{core} \equiv n = 1.5$$

$$n_{clad} \equiv n_s = n(1 - 0.01) = \frac{1.5}{1.01}$$

if the waveguide is to be single mode, that is, only the fundamental $E^x_{11}$ and $E^y_{11}$ modes are to be supported, then side a can be defined as:

$$a = \frac{0.65}{(n^2 - n_s^2)^{1/2}}\lambda \approx 3.07\lambda$$

Therefore, if laser light of telecommunications wavelength $\lambda=1.5$ μm is used, the side of the waveguide must have dimensions of about 4.6 micrometers. If a conventional He—Ne laser with $\lambda=0.6328$ μm is used, a smaller waveguide having a side dimension of about 2.0 micrometers is implemented.

These values are similar to those obtained for optical fibers, even though fibers do generally allow slightly larger dimensions for single-mode operation.

A specific three-dimensional coupler embodiment in which a 4×4 configuration is defined (in this standard terminology 4×4 represents 4 input and 4 output waveguides) is illustrated in the perspective view of FIG. 17. It should be noted that while this coupler is termed 4×4 in actuality it embodies a pair of a traditional 2×2 directional coupler matrix. The coupler consists of four rectangular waveguides with parameters chosen so that each guide supports only a single fundamental mode. According to the previous section in which $\lambda=1.5$ μm, the side of the square cross-section of each waveguide will be of the order of 5 μm. Defining the amplitudes of the fields in each waveguide as:

$$E(x, y, z)=a(z)e(x, y)e^{-jk_z z}$$

then the coupled mode equations are defined as:

$$\frac{da_A(z)}{dz} = -jC_{BA}e^{jk_{AB}z}a_B(z) - jC_{CA}e^{-jk_{CA}z}a_C(z)$$

$$\frac{da_B(z)}{dz} = -jC_{BA}e^{-jk_{AB}z}a_A(z) - jC_{BD}e^{jk_{BD}z}a_D(z)$$

$$\frac{da_C(z)}{dz} = -jC_{CA}e^{jk_{CA}z}a_A(z) - jC_{CD}e^{-jk_{DC}z}a_D(z)$$

$$\frac{da_D(z)}{dz} = -jC_{BD}e^{-jk_{BD}z}a_B(z) - jC_{CD}e^{jk_{DC}z}a_C(z)$$

where $k_{BD}=k_B-k_D$, etc, is the difference between the propagation constants of the guided modes in the respective guides, and $C_{XY}$ is the coupling coefficient between the guides X and Y.

To comprehend the behavior of the solutions of these couple mode equations a simplified model is defined in which the phase matching condition, $k_{XY}=0$, is assumed. This assumption can be made in the case in which the guides comprising the three-dimensional structure are generally identical. In application, it is necessary to assume the phase matching condition, since, as the simple 2-coupler analysis shows, only if the assumption is made can an expectation of full power transfer be realized. Also, it is necessary to set all the coupling coefficients to be equal to 1 cm$^{-1}$ for the purposes of modeling. This is consistent with the order of magnitude that one has for most practical couplers.

The system is solved subject to an initial condition $a_{A0}=1$, $a_{B0}=a_{C0}=a_{D0}=0$, thus the incident power is normalized to 1 and all the light is initially sent into the guide A.

The results are shown in FIG. 18, which depicts a graph of the power functions $P_X(z)=|a_X(z)|^2$, etc, as functions of the propagation distance z. The solid line represents the power function for the "initial" waveguide A, the full dotted line represents the diagonally opposed waveguide D, and the intermittent dotted line represents identical power functions of the waveguides B and C. The graphed results indicate that full power transfer in a symmetric 4×4 coupler is possible only between the diagonal waveguides A and D, while the neighboring waveguides B and C are limited to a maximum power transfer of one quarter of the incident power. Additionally, the total power in the waveguides is conserved and remains equal to 1. This can be proved by plotting the sum of all power functions, the result being almost a straight line with an error of about 0.2%. It should be noted that full power transfer occurs at lengths in the range of about 1 to about 3 centimeters; a length that is similar but slightly longer than the typical coupling length of a simple 1-dimensional coupler.

The overall behavior of the guided mode having a fixed coupling length z is generally dependent on the wavelength $\lambda$. To emphasize this wavelength dependency a hypothetical is illustrated which renders an approximate solution of the series of coupled mode equations for waveguide A (lower left corner waveguide of FIG. 17) with n=1.5, $n_1$=1.485 and s=d=4 μm, and for a coupling length z=2.19 cm. The solution is obtained as a series solution of the matrix form of equations, and the series is summed up to the 25-th term. The summing process can be accomplished using Maple Software available from Waterloo Maple Incorporated of Waterloo, Ontario, Canada. The result of this hypothetical is shown in the graph of FIG. 19. It is noted that when $\lambda \approx 1.54$ μm the entire incident power couples into the waveguide D (upper right corner waveguide of FIG. 17). Alternatively, when $\lambda \approx 1.35$ μm, the entire power returns into the waveguide A. This hypothetical verifies that the three dimensional coupler device can be implemented as an add/drop filter.

In an alternate application, if an optical beam of $\lambda=1.54$ μm is launched into the input of waveguide A (lower left corner waveguide of FIG. 17), and an optical beam of $\lambda=1.35$ μm is launched into the input of waveguide guide D (upper right waveguide of FIG. 17), then the output of waveguide D will comprise both the wavelengths. Conversely, if both wavelengths are launched together into waveguide A, then at the output they will generally be separated into one wavelength per output. (i.e. one wavelength for the output of waveguide A and one wavelength for the output of waveguide D). Thus, the three-dimensional coupler device can be implemented to serve as a multiplexer or demultiplexer, thereby supporting WDM.

In practice, it is desirable to have the wavelength separation as small as possible, therefore the device needs to be designed so that parameters take into account the small degree of wavelength separation. For instance, if the goal is to separate wavelengths $\lambda=1.555$ μm and $\lambda=1.560$ μm at the coupling length of 5 mm, then computations show that the coupling coefficient between the waveguide generally must be $C=A\lambda$, with $A\approx 2.144$ cm$^{-1}$ μm$^{-1}$. This can be shown by implementing a known approximate formula for the coupling coefficient:

$$C = \frac{h^2 p e^{-ps}}{\pi a(h^2 + p^2)}\lambda$$

where s is the separation between the waveguides, a the side of each rectangular waveguide, and $$h=(n^2 k_0^2 - \beta^2)^{1/2}$$

$$p=(\beta^2 - n_1^2 k_0^2)^{1/2}$$

and a fixed value $\lambda=1.555$ μm can be taken in $$\beta = \frac{2\pi n}{\lambda} \text{ and } k_0 = \frac{2\pi}{\lambda}.$$

In this instance, in order to guarantee the required wavelength separation for single-mode waveguide size a=4 μm, the waveguide separation must be s=2.76 μm.

The behavior of the device will characteristically change if the waveguides are asymmetric. For instance, (referring to FIG. 17), the distance between waveguide A and waveguide C (as well as waveguide B and waveguide D) could be made smaller than the distance between waveguide A and waveguide B (and waveguide C and waveguide D). For the purposes of numerical computation, this situation can be simulated by introducing a slight difference in the corresponding coupling coefficients. For example, we may set the following coupling coefficients as:

$$C_{AB}=C_{CD}=1 \text{ cm}^{-1},$$

$$C_{AC}=C_{BD}=1.1 \text{ cm}^{-1}$$

With this change, the system of coupled mode equations can be solved to yield the graphical result shown in FIG. 20. From this graph it is evident that unlike the symmetric case, the adjacent waveguides B and C will generally have a large percentage of the incident power transferred into them during coupling. Precisely, up to about 96% of the incident power can be transferred into waveguides B and C. These results indicate that the three dimensional coupler having asymmetric waveguides can be implemented as a multichannel switch. In this regard, if the coupling coefficients are varied between the waveguides, for example, by electro-optical means, then power incident into one of the input channels could be diverted into any of the output channels. By incorporating a photo-refractive material for the substrate, the coupling coefficients could be optically altered, resulting in an all-optical switch.

FIG. 21 illustrates a schematic, perspective view of a three dimensional coupler incorporating 5 waveguides in a star-like formation, in accordance with another embodiment of the present invention. As depicted, in an embodiment in which the waveguides are symmetric, the incident light may be launched into the central waveguide 800 or the incident light may be launched into one of the adjacent side waveguides 810, 820, 830 and 840. The coupling mode equations for these two cases are solved separately, again by accepting a model with all coupling coefficients equal to 1 $cm^{-1}$. The numerical results are represented in the graphs of FIG. 22 (incident light into the central waveguide 800) and FIG. 23 (incident light into waveguides 810, 820, 830 and 840). It is observed that in either instance there is no full power transfer as such, but all power returns eventually into the waveguide from which the incident light was initially sent. It should be noted that the models have been calculated by assigning an arbitrary numerical value to the coupling coefficients. In actual device design it will be necessary to calculate these quantities from the known parameters of the individual waveguides and separation distances between them.

Many modifications and other embodiments of the invention will come to mind to one skilled in the art to which this invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

The invention claimed is:

1. An optoelectronic device comprising:
   a substrate having a first surface; and
   at least one optical interconnect formed on the first surface of said substrate comprising a sol-gel based material including an active region defined in the sol-gel based material, wherein the active region comprises rare earth ions.

2. The optoelectronic device of claim 1, wherein the rare earth ions have transition lines in the about 0.2 micron to about 3.0 micron spectrum when illuminated by at least one optical source.

3. The optoelectronic device of claim 1, wherein the rare earth ions have transition lines in the about 1.5 micron range when illuminated by at least one optical source.

4. The optoelectronic device of claim 1, wherein the rare earth ions comprise a rare earth ion chosen from the group consisting of erbium, ytterbium and neodymium ions.

5. The optoelectronic device of claim 1, wherein the rare earth ions comprise erbium and ytterbium ions.

6. The optoelectronic device of claim 1, wherein the sol-gel based material further comprises at least one electro-optic organic component.

7. The optoelectronic device of claim 1, wherein the active region is capable of being optically side-pumped.

8. The optoelectronic device of claim 1, further comprising at least one optical source for optically pumping the active region.

9. The optoelectronic device of claim 8, wherein the at least one optical source is chosen from the group consisting of at least one vertical cavity surface emitting laser (VCSEL), at least one fiber laser, at least one waveguide laser and at least one semiconductor laser.

10. The optoelectronic device of claim 8, wherein the at least one optical source is used to side-pump the active region of the optical interconnect.

11. The optoelectronic device of claim 8, further comprising an optical detector that is in optical communication with the optical interconnect for detecting an optical signal within the optical interconnect.

12. The optoelectronic device of claim 11, wherein the optical detector comprises a sol-gel based material.

13. The optoelectronic device of claim 1, wherein the at least one optical interconnect further comprises grating structures formed on the at least one optical interconnect.

14. The optoelectronic device of claim 13, wherein the grating structures have a fixed periodicity.

15. The optoelectronic device of claim 13, wherein the grating structures have a chirped periodicity.

16. The optoelectronic device of claim 1, wherein the at least one optical interconnect further comprises prism structures formed on the at least one optical interconnect.

17. The optoelectronic device of claim 1, wherein the active region comprises rare earth ions surrounded by a tris (8-hydroxyquinoline) molecule.

* * * * *